United States Patent [19]

Sheets

[11] Patent Number: 4,698,486
[45] Date of Patent: Oct. 6, 1987

[54] METHOD OF HEATING SEMICONDUCTOR WAFERS IN ORDER TO ACHIEVE ANNEALING, SILICIDE FORMATION, REFLOW OF GLASS PASSIVATION LAYERS, ETC.

[75] Inventor: Ronald E. Sheets, Santa Ana, Calif.

[73] Assignee: Tamarack Scientific Co., Inc., Anaheim, Calif.

[21] Appl. No.: 699,425

[22] Filed: Feb. 7, 1985

Related U.S. Application Data

[63] Continuation-in-part of Ser. No. 584,322, Feb. 28, 1984, abandoned.

[51] Int. Cl.$^4$ .................... H01L 21/324; F27D 11/02
[52] U.S. Cl. .................................. 250/492.2; 219/405;
   219/411; 219/388; 118/50.1; 118/725; 437/247
[58] Field of Search ............... 219/388, 390, 405, 411,
   219/354, 347, 349, 85 BA, 85 BM, 343;
   118/50.1, 724, 725, 728, 729; 148/1.5;
   250/492.1, 492.2

[56] References Cited

U.S. PATENT DOCUMENTS

| Re. 24,296 | 3/1957 | Stewart | 219/405 |
|---|---|---|---|
| 1,587,023 | 6/1926 | Mottlau | 219/349 |
| 2,981,819 | 4/1961 | Gregory | 219/343 |
| 3,047,438 | 7/1962 | Marinace | 148/1.5 |
| 3,108,173 | 10/1963 | Barrett | 219/349 |
| 3,160,517 | 12/1964 | Jenkin | 117/93.3 |
| 3,188,459 | 6/1965 | Bridwell | 219/343 |
| 3,227,065 | 1/1966 | Litman | 219/349 |
| 3,239,651 | 3/1966 | Silberman | 219/343 |
| 3,240,915 | 3/1966 | Carter et al. | 219/343 |
| 3,460,510 | 8/1969 | Currin | 118/48 |
| 3,502,516 | 3/1970 | Henker | 148/175 |
| 3,623,712 | 11/1971 | McNeilly et al. | 263/41 |
| 3,627,590 | 12/1971 | Mammel | 148/1.5 |
| 3,661,637 | 5/1972 | Sirtl | 117/201 |
| 3,692,572 | 9/1972 | Strehlow | 117/201 |
| 3,836,751 | 9/1974 | Anderson | 219/354 |
| 3,913,872 | 10/1975 | Weber | 350/96.28 |
| 4,041,278 | 8/1977 | Boah | 219/411 |
| 4,081,313 | 3/1978 | McNeilly | 118/725 |

(List continued on next page.)

FOREIGN PATENT DOCUMENTS

| 55-11532 | 9/1980 | Japan. | |
| 56-48128 | 5/1981 | Japan. | |
| 57-80729 | 5/1982 | Japan. | |
| 57-20814 | 12/1982 | Japan. | |
| 32864 | 8/1921 | Norway | 219/349 |
| 938699 | 12/1960 | United Kingdom. | |
| 2065973 | 7/1981 | United Kingdom. | |

OTHER PUBLICATIONS

Myer, J. H., "Zoomable Kaleidoscopic Mirror Tunnel", Applied Optics, vol. 10, No. 9, Sep. 1971, pp. 2179-2182.
J. Vac. Sci. Technol. 20(1) Jan. 1982, Powell et al., pp. 33-36.
J. Appl. Phys. 53(2) Feb. 1982, Lietoila et al., pp. 1169-1172.
Short Notes Nov. 1982, K5-K7, Klabes et al.
Short Notes Nov. 1982, K9-K12, Sieber et al.
Japanese Journal of Applied Physics, vol. 19, No. 10 (Oct. 1980), pp. L563-L566, Nishuyama et al.
Appl. Phys. Lett. 30(2), Jul. 15, 1981, Powell et al., pp. 150-152.
Appl. Phys. Lett. 33(11), pp. 955-957, Dec. 1, 1978, Bomke et al.
Appl. Phys. Lett. 33(8), pp. 751-753, Oct. 15, 1978, Cohen et al.

*Primary Examiner*—E. A. Goldberg
*Assistant Examiner*—Teresa J. Walberg
*Attorney, Agent, or Firm*—Richard L. Gausewitz

[57] ABSTRACT

In accordance with the method, an integrating kaleidoscope and lamps combine to cause heating of a semiconductor wafer to achieve desired effects such as annealing, etc. In one form of the method, the heating of the wafer is such as to achieve rapid annealing by isothermal heating alone. In another form of the method the heating is such as to effect isothermal heating immediately followed by thermal flux heating.

65 Claims, 17 Drawing Figures

U.S. PATENT DOCUMENTS

| | | | |
|---|---|---|---|
| 4,097,226 | 6/1978 | Erikson | 219/405 |
| 4,101,759 | 7/1978 | Anthony | 219/405 |
| 4,115,163 | 9/1978 | Gorina et al. | 148/175 |
| 4,151,008 | 4/1979 | Kirkpatrick | 148/1.5 |
| 4,164,643 | 8/1979 | Peart | 219/411 |
| 4,220,483 | 9/1980 | Cazcarra | 148/1.5 |
| 4,224,096 | 9/1980 | Osborne | 156/380 |
| 4,233,493 | 11/1980 | Nath | 350/96.10 |
| 4,308,078 | 12/1981 | Cook | 148/1.5 |
| 4,315,130 | 2/1982 | Inagaki et al. | 219/121 |
| 4,331,485 | 5/1982 | Gat | 148/1.5 |
| 4,370,175 | 1/1983 | Levatter | 148/1.5 |
| 4,375,993 | 3/1983 | Mori et al. | 148/1.5 |
| 4,379,727 | 4/1983 | Hansen et al. | 148/1.5 |
| 4,421,048 | 12/1983 | Adema | 219/343 |
| 4,455,479 | 6/1984 | Itoh | 219/405 |
| 4,493,977 | 1/1985 | Arai | 219/405 |
| 4,533,820 | 8/1985 | Shimizu | 219/405 |
| 4,539,431 | 9/1985 | Moddel | 148/1.5 |
| 4,550,245 | 10/1985 | Arai | 219/405 |

OTHER PUBLICATIONS

"The Use of a Kaleidoscope to Obtain Uniform Flux, etc.", M. M. Chen et al., Applied Optics, Mar. 1963, vol. 2, No. 3, pp. 265–271.

"Rapid Optical Annealing Using the Water-Wall DC Arc Lamp", J. C. Gelpey et al., Microelectronic Mfg. & Testing, Aug. 1983, pp. 22–24.

"Introduction to Heat-Pulse® Processing Technology", AG Assoc., Arnon Gat et al., together with Appendices A–C.

Appendix B of the preceding article, entitled "Heat-Pulse Annealing, etc.", Arnon Gat, IEEE Electron, vol. EDL-2, No. 4, Apr. 1981, pp. 85 et seq.

Page 18 of article above, entitled "Activation of Arsenic-Implanted Silicon, etc.", Powell et al, Varian Assoc., Inc., Palo Alto, Calif.

Page 25 of article above, entitled "Incoherent Annealing of Implanted Layers in GaAs", Davis, et al.

Page 27 of article above, entitled "Radiation Annealing of GaAs Implanted with Si", Arai et al., vol. 20, No. 2 (Feb. 1981), pp. L124–L126.

"Rapid Large Area Annealing of Ion-Implanted Si, etc.", Lischner et al., pp. 759–764.

"Rapid Wafer Heating: Status 1983", Burggraaf, Semiconductor International, Dec. 1983, pp. 69–74.

"Short Time Annealing", Sedgwick, Journal of the Electrochemical Society, Feb. 1983, pp. 484–493.

"Transient Heating with Graphite Heaters for Semiconductor Processing", Fan et al., pp. 751–758.

"Ion Implantation & Rapid Annealing of 125 mm Wafers", Current et al., Solid State Technology, Oct. 1983, pp. 197–202.

"Crystallization of Silicon for Solar Applications", Von Gutfeld, IBM Tech. Disc. Bull. 19 (1977), p. 3955.

"Thermally Assisted Flash Annealing of Silicon & Germanium", Cohen et al., Appl. Phys. Letts. 33 (Oct. 1978), 751 et seq.

"Cone Channel Condenser Optics", Williamson Associates, Inc., Cambridge, Mass.

"Transmission Properties of Optical Fibers", R. J. Potter, Institute of Optics, Rochester, N.Y.

"Fiber Optics. Part II. Image Transfer on Static & Dynamic Scanning with Fiber Bundles", Kapany et al.

Brochure entitled "Products. Capabilities" of Tamarack Scientific Co., Inc. (assignee herein).

NASA Tech Brief B75-10008, Apr. 1975.

"Transient Colorimeter Calibration System", by Tamarack Scientific (assignee herein), Technical Report AFFDL-TR-7524, Mar. 1975.

Brochure entitled "Tamarack Searchlight Model-100" by Tamarack Scientific (assignee herein).

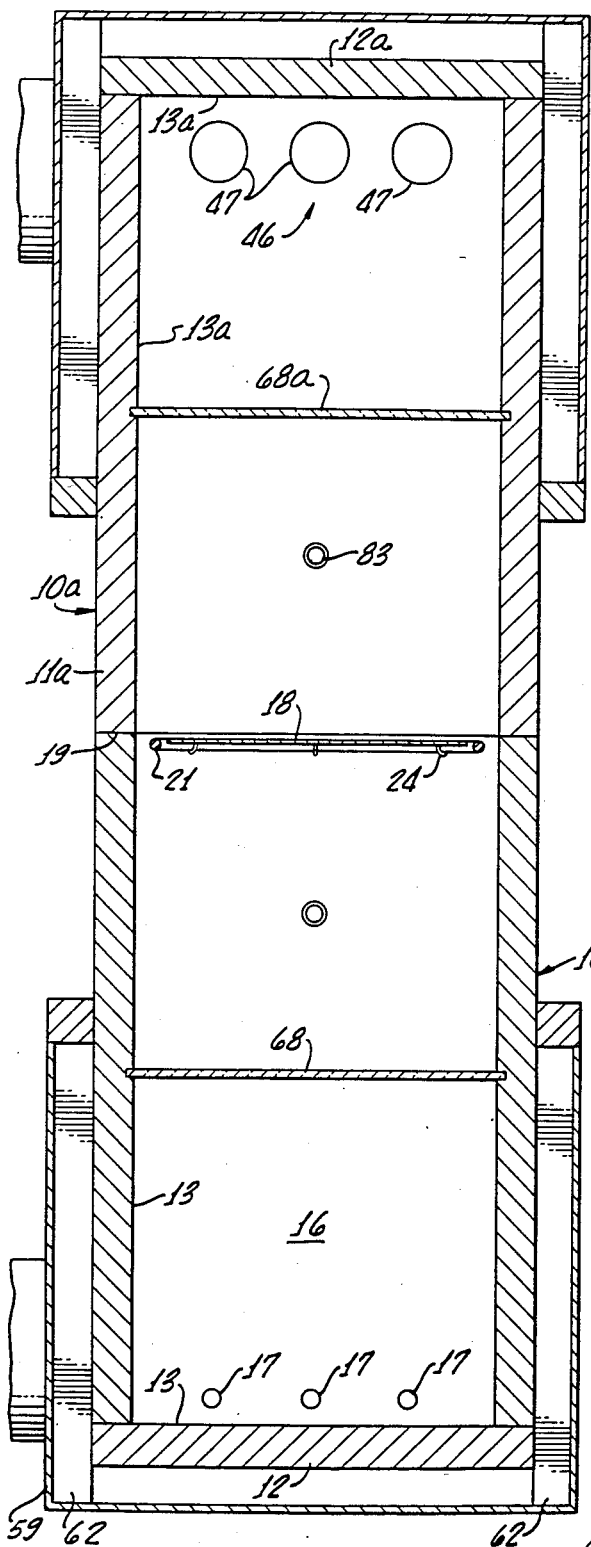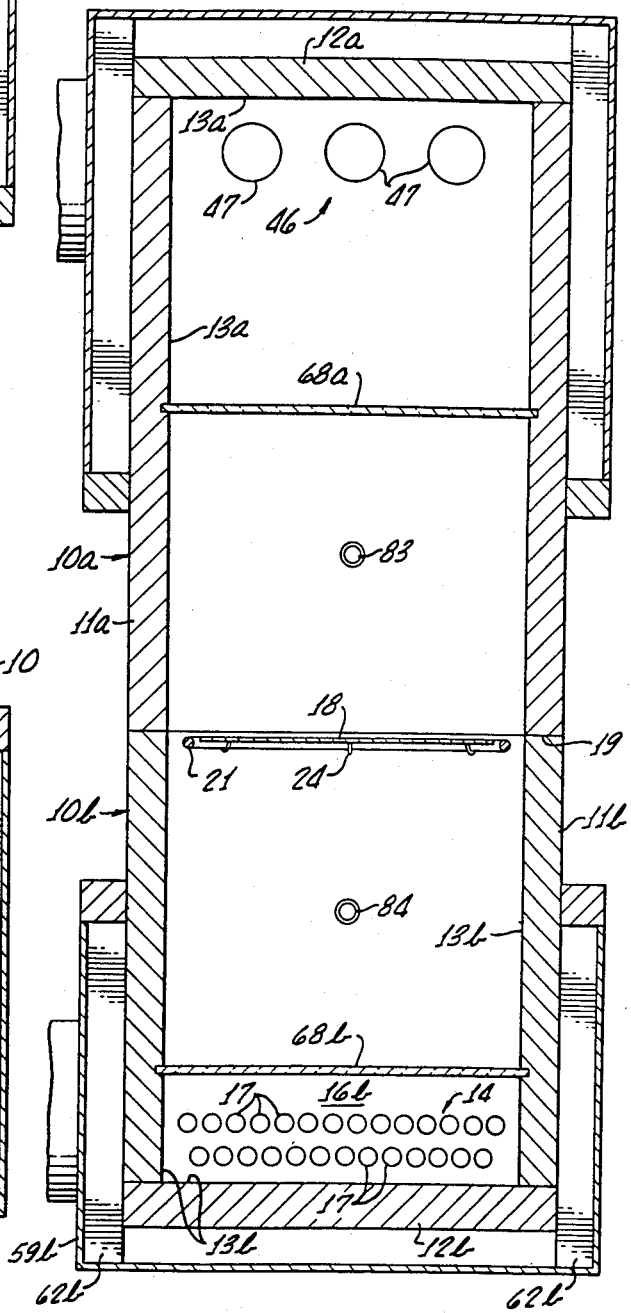
FIG. 5.
FIG. 6.

METHOD OF HEATING SEMICONDUCTOR WAFERS IN ORDER TO ACHIEVE ANNEALING, SILICIDE FORMATION, REFLOW OF GLASS PASSIVATION LAYERS, ETC.

CROSS-REFERENCE TO RELATED APPLICATION

This application is a continuation-in-part of co-pending patent application Ser. No. 584,322, filed Feb. 28, 1984, now abandoned, for Apparatus and Method For Heating Semiconductor Wafers In Order To Achieve Annealing, Silicide Formation, Reflow of Glass Passivation Layers, Etc., inventor Ronald E. Sheets.

The present apparatus and method have important application relative to various aspects of the manufacture of semiconductor wafers and integrated circuits. For example, the apparatus and method will effect reflow of glass passivation layers, and will achieve formation of silicides. However, the method portions of the following detailed description are directed primarily to the annealing of ion-implanted semiconductor wafers in order to relieve stresses generated by ion implantation, in order to fully activate the implanted dopants, and to provide solid phase epitaxial regrowth so as to restructure damaged crystal lattices.

BACKGROUND OF THE INVENTION

Semiconductor materials (for example silicon, gallium arsenide, etc.) are at present conventionally implanted with dopants by devices which utilize high voltages to accelerate ions of the impurities into the surface of the semiconductors. The amount of penetration of the dopants is determined by the degree of voltage acceleration of the dopant ions, and is, for example, 0.2 microns. The annealing which necessarily follows the ion implantation has, historically, been—and still is—effected primarily by means of thermal fusion furnaces. Each of these is a long quartz tube having a diameter of, for example, four inches to seven inches, and a length of, for example, four to six feet. Heating coils are wrapped around the tube, and furnace boats are passed therethrough, each boat containing, for example 30-40 wafers. The temperature in the furnace is brought slowly up to a desired level, for example, 1000° C., following which there is a holding period, following which there is a slow period of cooling. The amount of time required for a semiconductor wafer to be annealed in such a furnace is, typically, 30-60 minutes.

There have been major pressures tending toward rapid annealing (short time annealing) of large-diameter semiconductor wafers. Many papers and many patents have been written on the subject of rapid annealing, and various approaches have been made. In rapid annealing, it is typical to effect heating of the wafer to a high temperature in a short period of time, and then to hold the wafer at the elevated temperature for about one to twenty seconds. By keeping the process as short as possible, the implanted ions do not have time to diffuse into the bulk semiconductor material, and circuit speed is maximized. Referring to FIG. 9, the amount of diffusion resulting from certain prior-art rapid annealing processes is illustrated by the intermediate curve, which is seen to be very close to the "as implanted" curve.

It is extremely difficult to achieve effective, commercially-satisfactory rapid annealing of large-diameter semiconductor wafers. Major reasons for the difficulties reside in the characteristics of the wafers themselves. Some of these characteristics will now be mentioned.

The wafers may be four, five or six (or more) inches in diameter, yet are typically only 0.5 millimeters thick. This extreme thinness, in comparison to diameter, means that radiant energy transmitted to one region of the wafer will not be thermally conducted, rapidly, to another region thereof. And, as stated below, the heat—instead of being thermally conducted through the wafer to another region—will be predominantly radiated away from the wafer.

Because of the wafer's size, and because the average specific heat of silicon is 1.0 joules per gram, the energy required to heat a silicon wafer to 1000°-1200° C. in a few seconds is substantial. For the typical 0.5 mm thick wafer, it requires 145 joules per centimeter squared in order to bring the temperature to 1200° C. At a temperature of 1200° C., the wafer will radiate (lose) 18 watts/cm squared (based on a emissivity of 0.7) over the entire area of the wafer. Thus, as an example, a four inch wafer will radiate a total of over 2.8 kilowatts when it is at 1200° C. In order to hold the wafer at 1200° C., it is necessary for the wafer to continuously absorb 36 watts/centimeter squared for one-sided heating, or 18 watts/$cm^2$ for double-sided heating.

Referring next to the optical properties of the semiconductor materials, it is emphasized that most have a very high index of refraction (3.0 to 4.0) in the wavelength range of 0.3 to 4.0 microns, which means that the materials reflect from 30 to 40 percent of the incident radiation. This is many times higher than what would be the case relative to, for example, glass. Not only is there much reflection, but there is a large amount of transmission of the radiation through the wafers when they are relatively cold. From 40-50 percent of the incident radiation in the range from 1.1 to 8 microns is transmitted through the wafer at temperatures below 500°-600° C. Thus, the wafers are radiating, reflecting and transmitting large amounts of energy.

A further characteristic of the wafers is that they are highly subject to thermal and physical stresses, being easily distorted instead of remaining flat as desired. Furthermore, regions thereof may tend to ripple when thermally shocked.

An additional important characteristic is that relatively long "rapid annealing" tends to reduce adverse effects caused by disuniform heating, that is to say, transmission of radiant energy in differing amounts to different regions of the wafer. However, such relatively long "rapid annealing" is not desired, because it slows production and tends to increase downward diffusion of the dopant and thus reduce circuit speed.

The problems of rapid annealing, and prior-art attempted solutions of such problems, are well summarized by two articles, one of which is: "Rapid Wafer Heating: Status 1983" by Pieter S. Burggraaf (Semiconductor International, December, 1983, pp. 69-74). A somewhat less recent overview is "Short Time Annealing" by T. O. Sedgwick (Journal of the Electrochemical Society: Solid-State Science and Technology, February, 1983, pp. 484-493). Both of such articles are hereby incorporated by reference herein.

The Burggraaf article emphasizes the great need for uniformity, stating (p. 70) that" . . . wafer-temperature uniformity is perhaps the most important issue that each vendor has addressed in designing its specific system. Wafer-temperature uniformity is important in rapid wafer heating to minimize slip (crystal dislocation) and wafer flatness distortions that occur at high temperature. Wafer-temperature uniformity also affects dopant-activation and junction-depth uniformities. Uniform heating, in fact, is a major challenge in making rapid wafer heating a production tool . . . Wafer-temperature uniformity requires that the radiation field be very uniform."

Relative to the mention of junction-depth uniformities in the quoted statement, it is emphasized that since the wafers are cut up into many hundreds of elements, and it is important that all of these elements be alike, variations in junction-depth resulting from temperature disuniformity are one of the factors which have been adverse to bringing rapid annealing into a viable production-line status.

In the above-cited Sedgwick article, it is pointed out that there is need to operate at as high a temperature as possible in order to both activate the implanted ions and relieve several types of point defects. Applicant is of the opinion that much of the high temperature work has been adequate in regard to temperatures, but has involved scanning laser beams which heat in small localized areas and develop strains, slippage, ripples and other damage.

A further major factor relating to the viability of rapid annealing is wafer contamination, which is discussed in (for example) the Burggraaf article (pp. 70 and 71). To prevent contamination, it is important to rapidly heat the wafer to 800°–1100° C. (or higher) without touching it or contaminating it in any way. Thus, for example, use of a preheated plate at high temperatures is distinctly undesirable, for reasons including the fact that material from the plate would enter the wafers in the indicated temperature range.

Other very important factors relating to the question of whether or not rapid annealing apparatus achieves widespread production-line use are the cost of the apparatus and the cost and difficulty of operating and mantaining it. Efficiency, simplicity, relative compactness, ruggedness, ease of maintenance, etc., are of major importance here as in other production-line operations. And, of course, speed of operation—as well as versatility and accuracy (for example, accurate temperature control)—are paramount considerations.

Among the myriad attempts to achieve uniformity of temperature in rapid annealing and other processes, there frequently occur two approaches. One is to transmit the radiant energy through diffusers, for example, quartz sheets or housings that have been sand-blasted or otherwise treated so as to diffuse light. The other approach, which is often used with the first, is to employ susceptors which engage the wafers and aid in heat distribution. Both of these approaches are not desired, and the need therefor is eliminated by the present method and apparatus. One reason the approaches are not desired is that they drastically increase the time required to heat and cool the wafers, thus increasing cycle time and wasting enormous amounts of power.

DEFINITIONS OF CERTAIN TERMS, ESPECIALLY RELATIVE TO WAFER HEATING

There are essentially three methods of heating a semiconductor wafer:

(a) Adiabatic—where the energy is provided by a pulse energy source (such as a laser, ion beam, electron beam) for a very short duration of $10\text{--}100 \times 10^{-9}$ seconds. This high intensity, short duration energy melts the surface of the semiconductor, to a depth of about one to two microns.

(b) Thermal flux—where energy is provided for $5 \times 10^{-6}$ to $2 \times 10^{-2}$ seconds. Thermal flux heating creates a substantial temperature gradient extending much more than two microns below the surface of the wafer, but does not cause anything approaching uniform heating throughout the thickness of the wafer.

(c) Isothermal—where energy is applied for 1–100 seconds so as to cause the temperature of the wafer to be substantially uniform throughout its thickness at any given region.

Reference is made to FIG. 8 of the present application for hypothetical illustrations of isothermal, thermal flux, and adiabatic heating. These curves are not completely to scale. The flat region at the upper end of the adiabatic curve is at the melting point of silicon, 1410° C., and results from the latent heat of fusion required to melt the up to two micron upper layer of the wafer.

The word "longitudinal" denotes, in the specification and claims, the direction that extends between lamps and workpiece.

SUMMARY OF THE INVENTION

The present invention provides practical, economical and efficient apparatus and methods for achieving rapid heating of semiconductor wafers by thermal radiation in the visible and infrared regions of the spectrum. Of great importance is the present optical coupling of the radiant source (tungsten-halogen lamps, xenon, arc, krypton arc, mercury arc, electrodeless radio frequency discharge source, etc.) to the wafer being treated. The present coupling is such that the intensity of radiation in the target plane, in which the wafer surface is disposed, is substantially uniform, thus preventing significant temperature gradients across the wafer. The uniformity is achieved without a requirement for any diffusers or susceptors.

In accordance with one of the aspects of the invention, an integrating light pipe is employed in combination with a radiant source disposed within the pipe, to couple the radiant source with the semiconductor wafer. In the highly preferred form, the integrating light pipe is a reflective integrating kaleidoscope containing the radiant source, and the combination achieves substantially uniform radiant flux at the target plane in a high-speed, efficient, economical, noncontaminating, and commercial manner.

In accordance with another aspect of the invention, an extension of the integrating light pipe is provided on the side of the water remote from the radiant source, and performs the functions of reflecting uniformly back to the wafer those substantial amounts of radiant energy which have passed through the wafer or around it, and radiated from it.

In a further important embodiment, the same or different radiant sources are provided in the extension of the kaleidoscope. In all cases, there is substantial uniformity of thermal radiation (both direct and reflected) on both sides of the semiconductor wafer.

No scanning lasers are required, but use of a nonscanning laser as one radiant source is contemplated, this being a large laser combined with an integrator which distributes the laser beam uniformly over the wafer surface.

There is further described a system for effecting substantially automatic heating of wafers in controlled environments for purposes of annealing, and for other purposes.

The invention also provides a combination of uniform isothermal heating and uniform thermal flux heating. Thus, isothermal heating is provided by a continuous wave (CW) radiant source located in the optical cavity. Power is controlled to the lamps in order to provide a temperature rise rate of about 200° to about 500° C. (for more) per second. When the wafer has reached a predetermined temperature in the range of about 800°-1100° C. for silicon, a second radiant source, namely a high-power pulsed lamp, is energized to quickly elevate the surface temperature of the silicon wafer to 1200°-1400° C. (or higher) and thus anneal the surface and remove defects.

The method described in the preceding paragraph achieves rapid wafer heating and annealing without any substantial touching of the wafer, and without danger of contamination thereof.

The rapid heating, and uniform optical coupling, result from placement of multiple (or few) quartz halogen lamps and multiple (or few) pulsed lamps in the same integrating optical cavity in order to achieve combined isothermal and thermal flux heating of the semiconductor material. The combined heating method, by which the wafer temperature is initially raised to, preferably, 800°14 1100° C. (for silicon) before thermal flux heating is effected to raise the surface temperature to, preferably, 1200°-1400° C., significantly reduces the internal stresses resulting from the very rapid annealing. The very rapid annealing, created by the described method, achieves solid phase epitaxial regrowth with minimum dopant diffusion.

Other important aspects of the invention relate to lamp arrangements, cooling, and temperature control.

BRIEF DESCRIPTION OF THE DRAWINGS

FIG. 5 corresponds to FIG. 4 but shows a much lesser number of lamps at the bottom of the apparatus;

FIG. 6 corresponds to FIG. 4 but shows a lower aspect ratio at the bottom;

The curves of FIGS. 8 through 11, inclusive, are theoretical only and are not presented as representing actual laboratory data. In FIG. 9, the curves relate to prior art.

DETAILED DESCRIPTION OF APPARATUS

Figure 1:
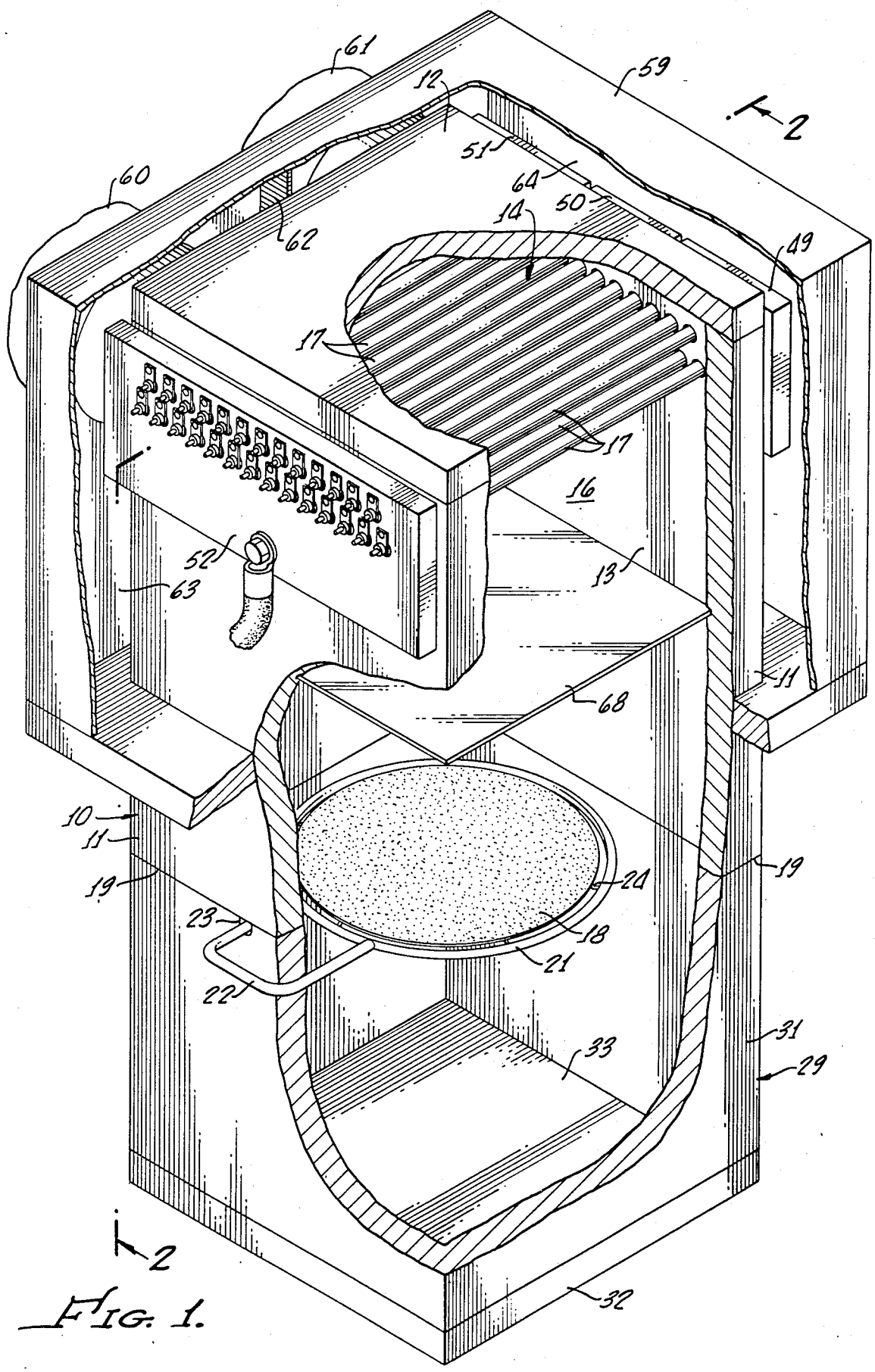
FIG. 1 is isometric external view of the integrating kaleidoscope, portions of the wall being broken away.

It has for decades been known, in arts including the heating of workpieces, to direct light or other radiant thermal energy nonuniformly into the entrances of integrating light pipes, the light pipes operating to render the light relatively uniform by the time the exit ends are reached. One type of such light pipes employs, wholly or partly, diffusely reflective surfaces on the interior thereof.

A second type of integrating light pipes, which has been used in the prior-art as stated above, is termed a "kaleidoscope". This second type is greatly preferred for reasons including its ability to achieve uniform temperatures, and its much greater efficiency. It has highly reflective and (at least primarily) nondiffusing internal walls arranged in predetermined cross-sectional shapes. These shapes include the square, the regular hexagon, the equilateral triangle, and the rectangle. All of such cross-sectional shapes will "nest", or fit together (without leaving voids), with cross-sectional shapes respectively identical thereto. For example, several equilateral triangles of identical size will nest with each other, as will several squares, etc. Reference is made to the first two pages of an article entitled "The Use of a Kaleidoscope to Obtain Uniform Flux Over a Large Area in a Solar or Arc Imaging Furnace", by M. M. Chen, J. B. Berkowitz-Mattuck, and P. E. Glaser (Applied Optics, March, 1963, Vol. 2, No. 3, pp. 265-271). Said first two pages (pp. 265 and 266 of Applied Optics) are hereby incorporated by reference herein.

As used in the present specification and claims, and except where specifically stated otherwise, the word "kaleidoscope" denotes such a reflective, integrating light pipe, described in the preceding paragraph, adaptive to achieve relative uniformity of radiant flux at a target plane by covering such target plane as the result of multiple reflections of the incident radiant energy by The planar and (at least primarily) nondiffusing interior walls of the light pipe. The expression "substantially nesting cross-sectional shape" is used, in some of the appended claims, to denote cross-sectional shapes that will nest with other identical shapes and sizes, as stated in the preceding paragraph. The word "substantially" is intended to comprehend cross-sections where the angles are not perfect but are still sufficiently close to perfect to create much uniformity. It is, however, pointed out that not only cross-sectional shape but aspect ratio and number of lamps are important, these factors being discussed subsequently in this specification.

The following quoted material constitutes portions of said above-referenced pages 265 and 266 of the above-cited Applied Optics article. (Titles, headings, footnotes and "Appendix A" of such pages are omitted, as are some paragraphs. The expressions "FIG. 1" and "FIG. 2" of such pages have been changed, respectively, to "FIG. 1a" and "FIG. 2a", such FIGS. 1a and 2a appearing in the drawings hereof.)

"The use of properly designed light pipes to redistribute the energy of a solar furnace or an arc imaging furnace is discussed. Compared to alternate schemes of obtaining uniform irradiation over a large area, the light pipe has the advantage of good uniformity without a serious loss of efficiency. Theoretical analyses concerning the principle of operation, as well as formulas for estimating the flux uniformity and reflection losses, are discussed. The results also indicate that the only suitable cross sections are the square, triangular, hexagonal, and rectangular. Other cross sections, including the circular, are not satisfactory unless used with diffusely reflecting surfaces.

"The termal flux at the focal spot of a typical solar furnace or carbon arc is of the order of 250 cal/cm²-sec, concentrated within a circular area approximately 0.6 cm in diameter. For many applications a smaller flux is required, spread uniformly over a larger area. The simple expedient of placing the sample in an off-focus position is not entirely satisfactory, because shadows from sample holder and supports limit flux uniformity more and more seriously with increasing distance from the focal plane. A superior technique that has been used successfully in this laboratory is to interpose a light pipe, or mirrored box, between the focal plane and the sample plane. This device collects the energy from the focal spot, reflects it a large number of times, like a kaleidoscope, and redistributes it uniformly over an area equal to the cross section of the light pipe. In the following sections, we describe the theory and application of several light pipes as flux redistributors in imaging furnaces.

Figure 1A:
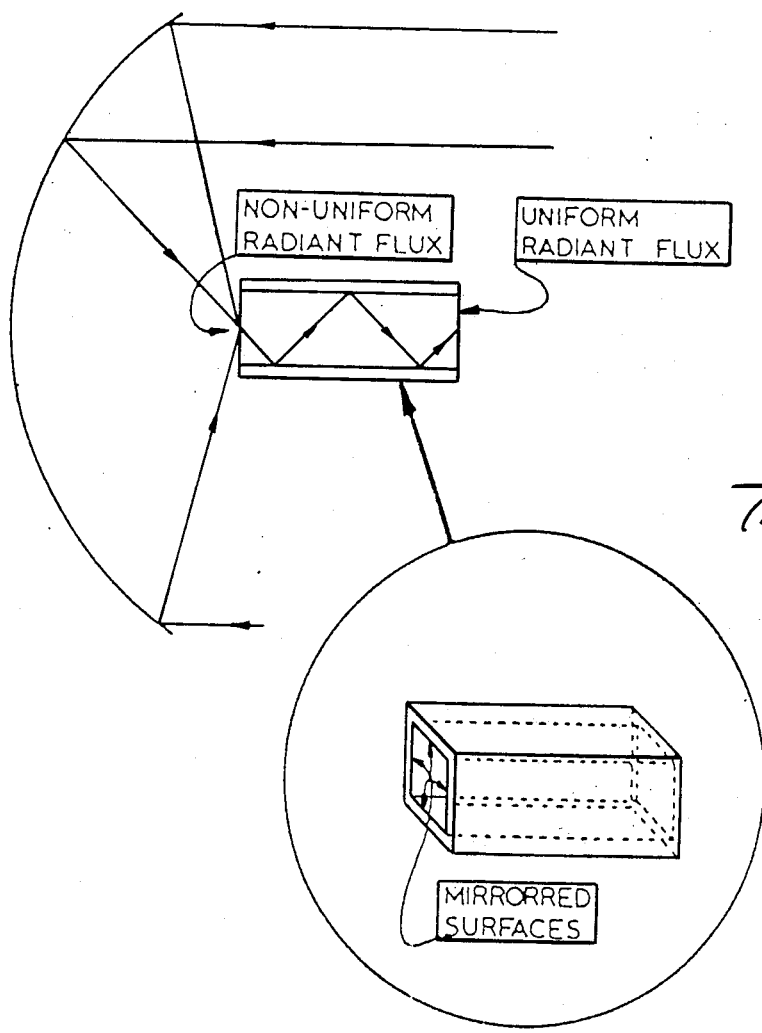
FIG. 1a shows prior art.

"The light pipe that has been used most frequently in our laboratory is shown in FIG. 1a. It is essentially a short pipe, 6 cm in length, with a 2×2 cm square cross section. The four inside surfaces are chromium-plated to a highly reflective mirror finish. When used in the solar furnace, the pipe is placed on the side of the focal point away from the collector mirror in such a way that the front surface of the light pipe coincides with the focal plane, and the focal spot is located at the center of the square opening. The sample is placed at the rear surface of the light pipe. This arrangement ensures that all of the radiation collected by the furnace also enters the light pipe and is used to irradiate the sample area. The only energy losses will be due to adsorption at the mirrored planes.

Figure 2A:
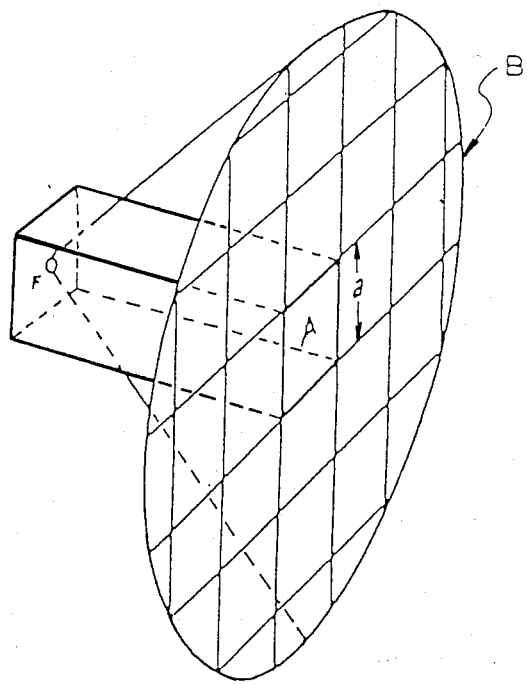
FIG. 2a shows prior art.

"In FIG. 2a, F denotes the focal spot of the solar furnace. If the light pipe were removed, energy would diverge from the focal point and illuminate an area B. The effect of the light pipe is to subdivide the area B into any array of squares and to re-sum the fragments over the area $A=a^2$, where a is a side of the cross section of the light pipe. In other words, the squares in area B are superimposed on each other at A. If an arbitrary point (x,y) is selected in the A plane, then all of the images of this point in the B plane are easily found by reflection. The flux intensity at (x,y) is simply the sum of intensities that would be observed at the image points, in the absence of the light pipe. Since each individual square of B contributes only a small portion of the total irradiance at A, nonuniformities in the flux that might have existed in individual squares cannot contribute significant nonuniformity to the exposed area A.

"While our experience has been confined almost entirely to square light pipes, other cross sections are obviously possible, and may be desirable for particular applications.

"In general, a straight light pipe, or one with constant cross-sectional area throughout its length, can be used to achieve uniform illumination over a sample area if, and only if, it can completely cover the plane by multiple reflections with respect to the straight sides. Thus, the useful cross sections appear to be the equilateral triangle, the square, the regular hexagon, and the rectangle. Such light pipes would effectively subdivide the B plane (FIG. 2a) into corresponding polygons, and the net intensity at any point of the A plane of the light pipe could be found by reflection as described above."

By the present invention, applicant makes use of an integrating light pipe, very preferably a kaleidoscope, in novel ways that achieve major results relative to the treatment of large-diameter semiconductor wafers. In accordance with one aspect of the invention, applicant does not funnel radiant flux into the light pipe from the outside but instead places sources of incoherent radiation in the pipe itself, very preferably near one end thereof, and such end is closed and internally high reflective. By placing the incoherent radiant sources on the inside, applicant causes the radiation to travel out in all directions for eventual reflection to a target plane located at a distance spaced from the radiant sources. The described aspect of the invention causes markedly increased compactness, efficiency and economy of the apparatus for a given degree of temperature uniformity at the target plane.

In accordance with another aspect of the invention, the semiconductor wafer is placed at any desired point along the length of the light pipe, at a distance sufficiently far from the radiant sources to achieve substantial uniformity of radiant flux across the plane, that is to say over the entire surface of the wafer. Great advantages—such as, for example, elimination of edge effects and achievement of high efficiency—are obtained when the wafer is not located at or adjacent any exit end but is instead disposed in a substantially fully-enclosed optical cavity all the walls of which are reflecting. That is to say, both end walls cooperate with the kaleidoscope sidewalls to form a substantially fully-enclosed optical cavity having a vast capability of uniformly heating a semiconductor wafer.

The diameter of the light pipe, namely, the diameter of the elongated cavity, may be increased to the extent desired, as required by the diameters of the semiconductor wafer or wafers being treated. Thus, for example, wafers four inches in diameter may be treated in kaleidoscopes having internal diameters of four and one-half inches. On the other hand, wafers six inches in diameter may be treated in kaleidoscopes having internal diameters of, preferably, about seven inches. When more than one wafer is treated at once, the cavity size is increased accordingly. These and subsequent examples are given by way of illustration only, not limitation.

Figure 4:
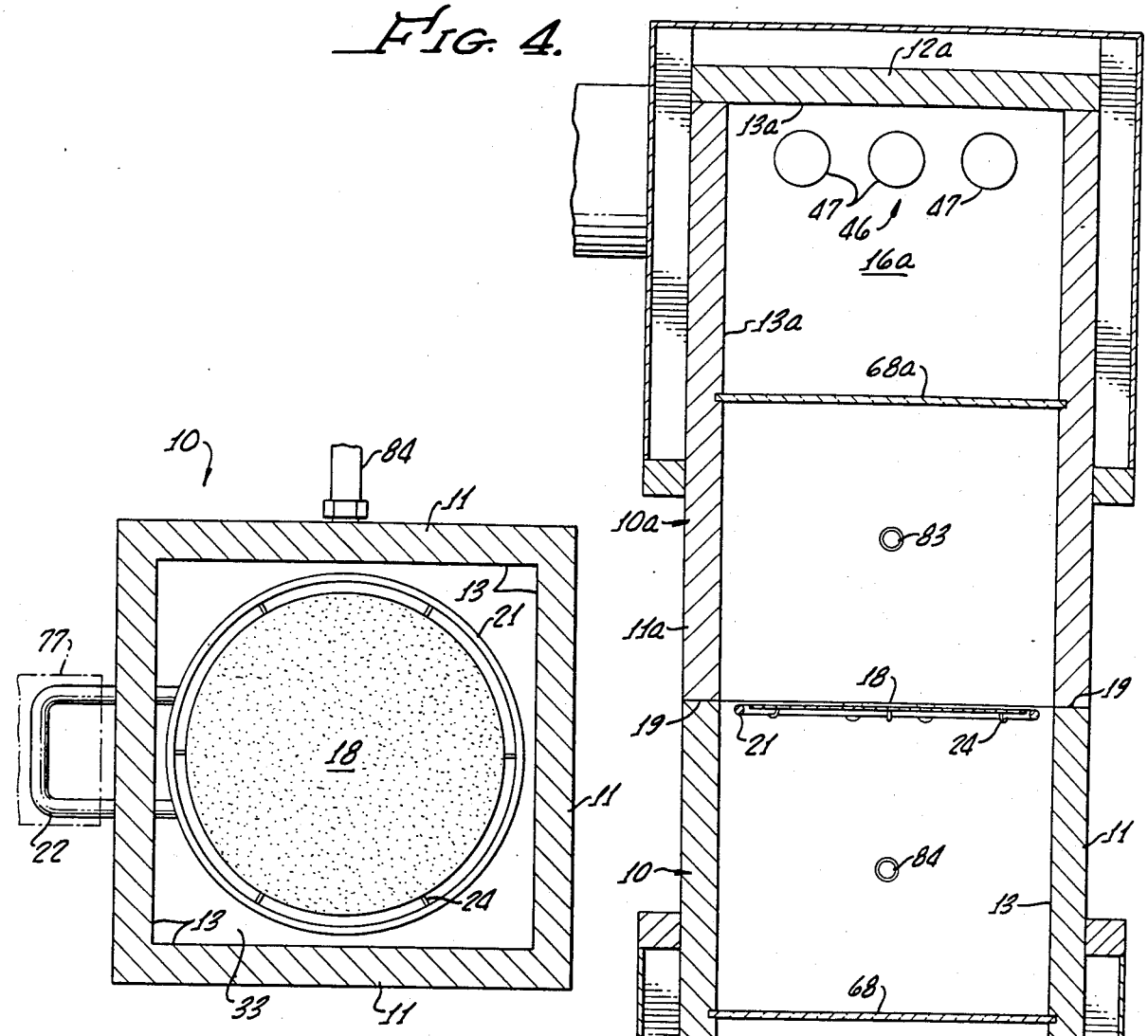
FIG. 4 is a vertical sectional view showing a second embodiment of the present apparatus, the section being taken in a plane perpendicular to that of FIG. 2 (which shows the first embodiment), so that the lamps in FIG. 4 are shown in section and not side elevation.
Figure 10:
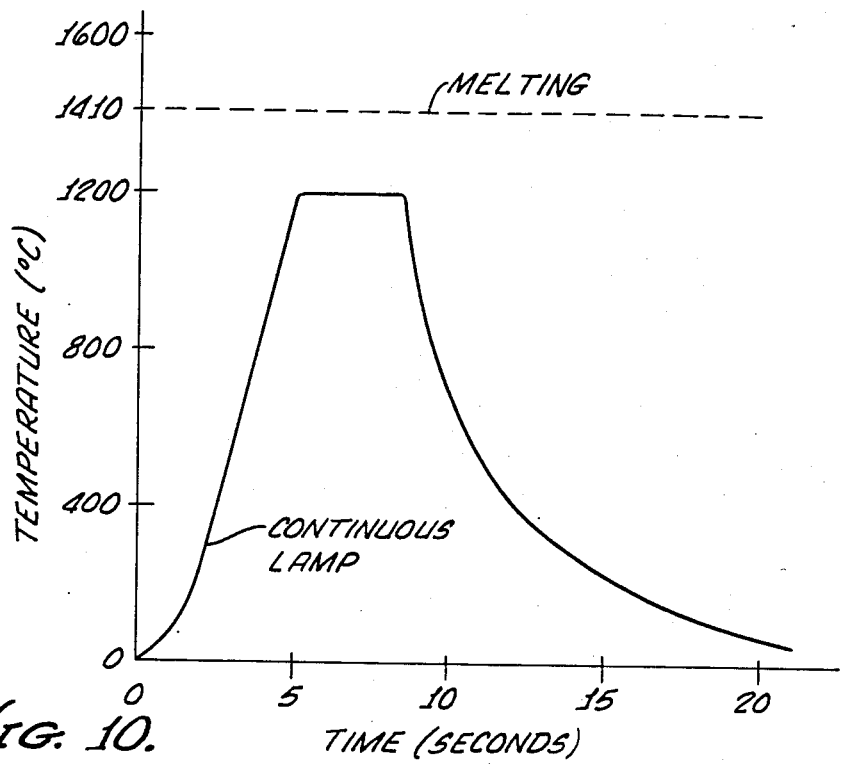
FIG. 10 is a graph showing a relationship of temperature to time for the first method embodiment.
Figure 11:
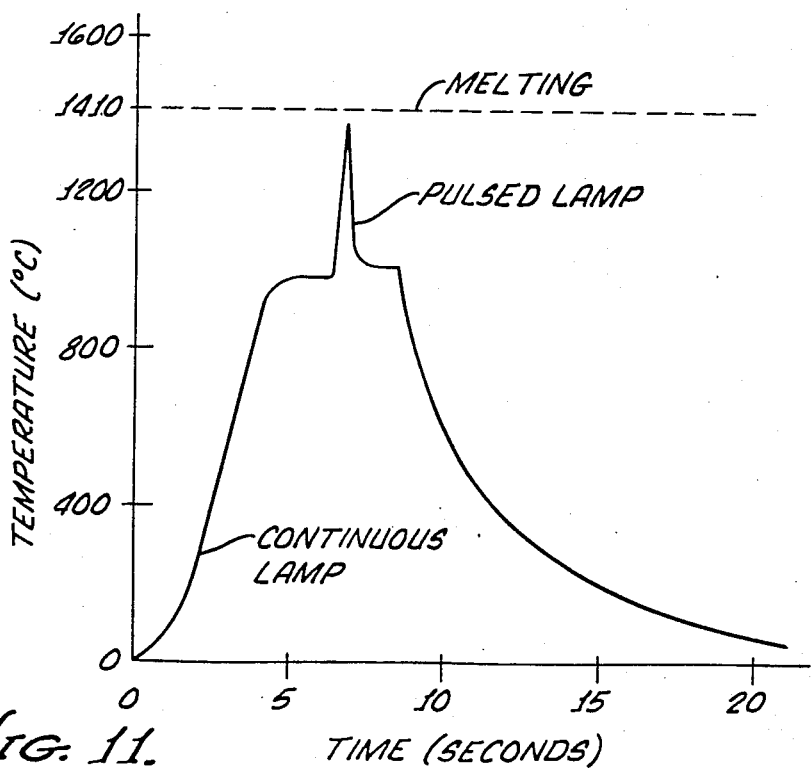
FIG. 11 corresponds to FIG. 10 but relates to the second embodiment of the method.

The first embodiment is illustrated by FIGS. 1–3 and 10. This embodiment is preferred at least for annealing semiconductor wafers having lower density implants, namely implant densities up to $5 \times 10^{15}$ ions/cm². The second embodiment, described subsequently relative to FIGS. 4 and 11, is presently preferred at least for annealing wafers having higher density implants, namely those semiconductor wafers having implant densities greater than $1 \times 10^{16}$ ions/cm².

Figure 2:
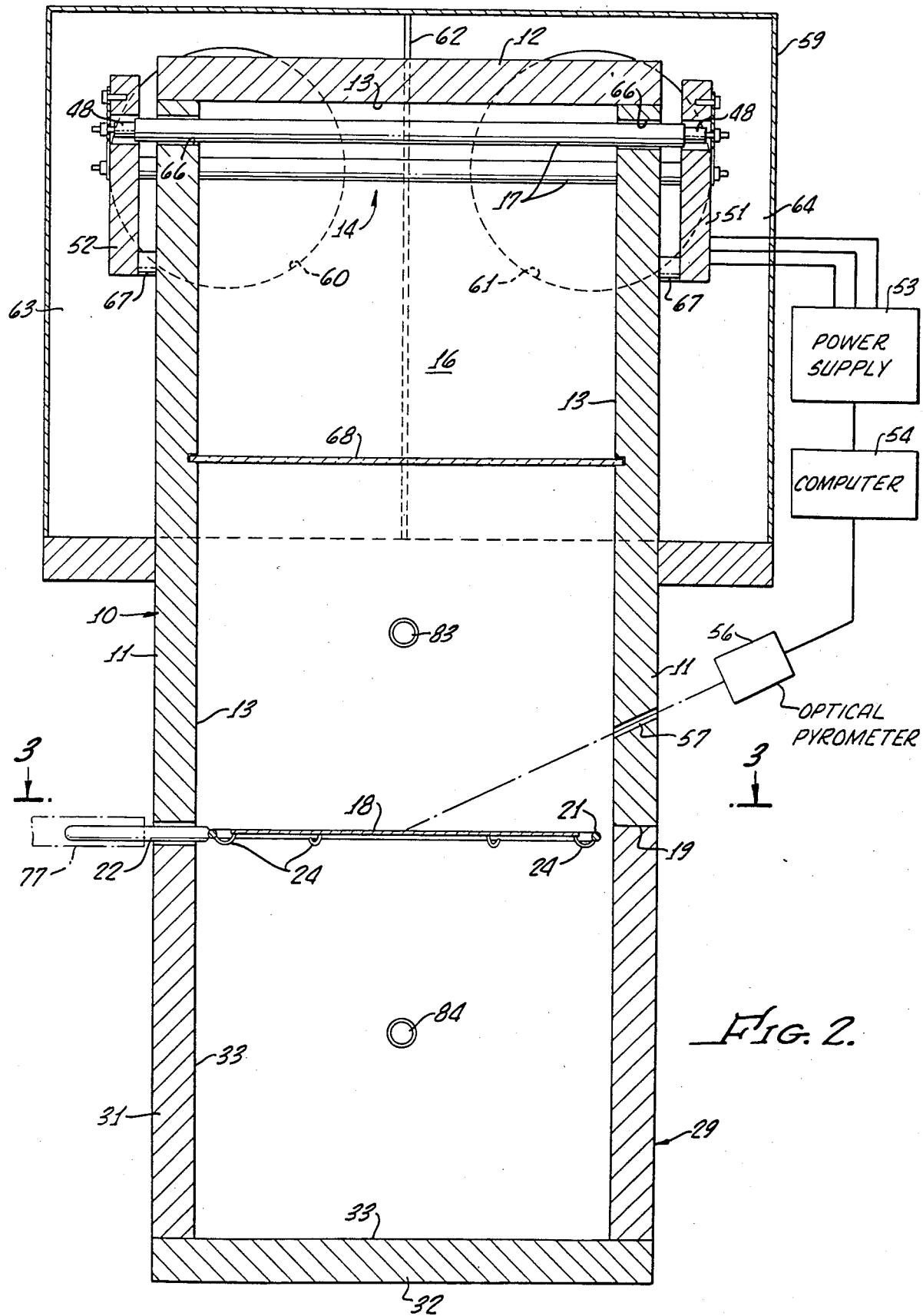
FIG. 2 is a vertical sectional view on line 2—2 of FIG. 1.
Figure 3:
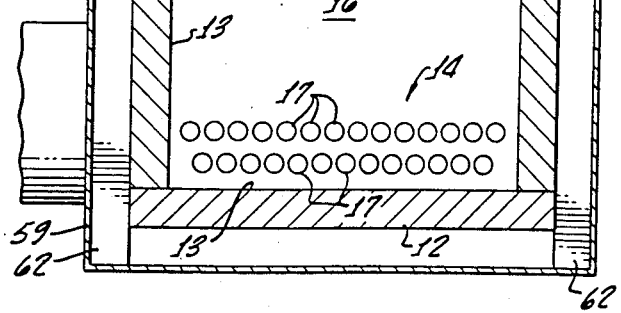
FIG. 3 is a horizontal sectional view on line 3—3 of FIG. 2.

Referring to FIGS. 1–3, an integrating light pipe of the kaleidoscope type is shown at 10. In the illustrated form, the light pipe is formed by four metal sidewalls 11 (for example, aluminum) which are secured together to form a perfect square (FIG. 3). The end of the pipe in which a radiant source is disposed, namely the upper end as viewed in FIGS. 1 and 2, is closed by a metal end wall 12 (for example, aluminum) which lies in a plane perpendicular to the longitudinal axis of the light pipe.

The internal surfaces of walls 11 and 12 are made hightly reflective of the type of radiation generated by the radiant source employed. At least relative to the preferred radiation source specified below, the internal wall surfaces are provided with nondiffusing coatings 13 of gold that has been evaporated onto polished surfaces.

As shown in FIGS. 1 and 2, the radiant source 14 is disposed within the optical cavity 16 defined by walls 11 and 12, and for maximized efficiency and compactness is located closely adjacent end 12. The preferred radiant source for continuous wave (CW) operation is an array or bank of relatively closely-packed lamps 17 which blanket, substantially entirely, the end of the cavity 16 and which radiate light in all directions. The preferred embodiment comprises a plurality of layers of parallel tubular lamps, which are offset row-to-row so as to maximize transmission of light from the upper layer down the kaleidoscope. The preferred lamps are quartz halogen, but other types of CW lamps, such as argon, xenon, mercury, etc., may be used. The lamps are disposed in planes perpendicular to the longitudinal axis of the kaleidoscope.

For performing some methods, the number of lamps may be reduced greatly, as described below relative to FIG. 5, for example.

The workpiece, in this case a semiconductor wafer, to be treated is numbered 18, being disposed in a target plane (or target area) that is perpendicular to the longitudinal axis of kaleidoscope 10. The illustrated wafer is just below the lower edges 19 of kaleidoscope walls 11.

As indicated previously, an extremely important and unique feature of the system is its ability to generate (practically, efficiently, economically, etc.) the substantially uniform radiant flux intensity at the wafer surface. This is accomplished by multiple reflections of the radiation (visible and infrared) emitted by the lamps. The radiation preferably emanates from the lamps in all directions. That radiation which emanates vertically-downwardly strikes the wafer surface directly, without being reflected. Other radiation reflects back and forth between the sidewalls 11 and then strikes the wafer surface. Additional radiation reflects off the end wall 12 and then down to the wafer surface, either directly or after reflecting off one or more walls 11.

Some of the radiation, namely that portion of the radiation which is in the planes of the lamp filaments, does not reach the wafer at all. Such radiation, however, performs the beneficial and energy-conserving function of aiding in heating of the filaments.

The wafer 18 is supported, in the illustrated form, by a ring 21 formed of quartz and having a diameter substantially larger than that of the wafer, the excess diameter being to prevent edge effects, namely, edge temperatures that are not the same as the temperature of the rest of the wafer. A handle 22, also formed of quartz, is connected to ring 21 and passes outwardly. Curved support elements 24 formed of quartz are connected to ring 21 and curve upwardly below wafer 18 for point-contact support therewith. In other words, the ends of the elements 24 remote from ring 21 are pointed and directed upwardly, to thus minimize contact between the wafer and the quartz.

It is possible to not have any cavity region below the wafer 18, but instead to place the wafer in or near the same plane as the lower edges 19 of sidewalls 11 of the kaleidoscope, and with no additional walls therebeneath. In such a form, baffles, reflectors etc., are provided around the wafer and in relatively close adjacency thereto but without touching. Although such a form works for some applications, in a certain degree, the form next described is highly preferred.

A second integrating light pipe, numbered 29, is mounted axially adjacent the first kaleidoscope 10. Light pipe 29 is, very preferably, a kaleidoscope constructed, and cross-sectionally sized and shaped, substantially identical to kaleidoscope 10, and rotationally and axially aligned therewith. Thus, the second kaleidoscope 29 cooperates with the first kaleidoscope 10 to form a single, longer, kaleidoscope having the wafer 18 at an intermediate region. Kaleidoscope 29 has sidewalls 31 and an end wall 32 which correspond, respectively, to sidewalls 11 and end wall 12, being the mirror images thereof. However, end wall 32 is closer to wafer 18 than is end wall 12, and still produces highly satisfactory results. Walls 31 and 32 have nondiffusely-reflective coatings 33 thereon.

When wafer 18 is relatively cold, shortly after energization of radiant source 14, much of the radiant energy is transmitted through the wafer as stated previously. Furthermore, much of the energy passes around the edge of the wafer, especially through the corner regions shown in FIG. 3. After the wafer becomes hot, it is a black-body radiator that radiates energy downwardly into the portion of the cavity below wafer 18. The large amounts of energy which pass through and around the wafer, and which are radiated from the wafer after it becomes hot, are reflected by the coatings 33 on walls 31 and 32 until, after a number of reflections, the energy passes upwardly to the target plane and strikes the bottom surface of wafer 18 in substantially uniform manner. Thus, wafer 18 is being rapidly heated from both sides even though, in the illustrated embodiment, only one radiant source 14 is employed.

It is a major feature of the invention that there are no edge effects; no substantial temperature difference between the edge regions of the wafer and the central regions thereof. The heating is substantially uniform across the entire wafer. Also, there is no contamination of any consequence, the only actual contact with the wafer being at the sharp points of the support elements formed of quartz. As described below, a controlled atmosphere, or a vacuum if desired, is maintained around the wafer to prevent oxidation thereof and achieve other desired results.

Full symmetry may be achieved by providing a second array of lamps 17, or other radiant thermal source 14, adjacent a bottom wall but at the same distance from wafer 18 as is the first array 14 therefrom. In such a form, the wafer 18 is radiated uniformly from both sides. In each instance, thermal flux from each radiant source ricochets between the reflective coatings a sufficent number of times to cause the flux to be uniform at the target plane, and, furthermore, energy that passes through and around the wafer ricochets a sufficent number of times to be uniform by the time it reflects back to the target plane.

DETAILED DESCRIPTION OF THE SECOND EMBODIMENT OF APPARATUS (FIGS. 4 AND 11)

FIGS. 4 and 11 show an embodiment where different types of radiant thermal sources are employed, one source being CW and the other pulsed or flash. Thus, the present embodiment is particularly adapted to be employed in the method by which isothermal and thermal flux heating are combined as indicated above, and as described in detail subsequently.

In FIG. 4, the radiant source 14 is shown as being at the bottom instead of at the top as illustrated in FIG. 1. The source 14 is shown in transverse section in FIG. 4, schematically, and it is to be understood that the arrangement of the lamps in source 14 at the bottom of FIG. 4 is identical to that described above relative to the FIGS. 1 and 2.

The upper integrating light pipe, very preferably the kaleidoscope as described, is indicated at 10a; the sidewalls thereof at 11a; the nondiffusing reflective coatings at 13a; and the end wall at 12a. The lower light pipe (kaleidoscope) is identical to the one described relative to the previous embodiment, but is inverted. Thus, the same reference numerals 10, etc., are used.

The radiant source at the upper end of kaleidoscope 10a is numbered 46. It is a pulsed or flash source, shown as being three flash tubes 47 disposed in parallel spaced relationship relative to each other in a plane perpendicular to the axis of the kaleidoscope. As an example, each of the three flash tubes 47 is a linear air-cooled flash lamp adapted to provide a 700 joules discharge in 50 to 100 microseconds. Because of the characteristics of the flash tubes, it is preferred that the nondiffusing reflective coatings 13a be aluminum instead of the gold preferably used relative to the quartz halogen CW lamps.

The flash tubes 47 may be, for example, xenon flash tubes and are strobed to achieve high-power and short-duration flashes. Because of the internal reflections in the kaleidoscope 10a, the large-area wafer 18 is heated uniformly by energy from the pulse source 46, it being understood that the flash tubes 47 are strobed simultaneously relative to each other.

In one (unshown) embodiment of the apparatus, the flash tubes 47 are omitted and a fly's-eye integrating lens is mounted centrally in upper wall 12a coaxially of the kaleidoscope 10a. A large neodymium-YAG or neodymium-glass laser is provided above the kaleidoscope 10a, with its beam directed at the fly's-eye integrator in wall 12a. The laser is then pulsed to provide, simultaneously and without scanning, radiant energy over the entire upper surface of wafer 18. Such pulse heating by the laser is rendered effective because of the uniform heating action provided by the CW source 14.

DESCRIPTION OF THE EMBODIMENTS OF FIGS. 5 AND 6, OF ASPECT RATIOS AS CORRELATED TO LAMP NUMBERS AND CHARACTERISTICS, AND OF CERTAIN OTHER FACTORS

Particular reference is made to the embodiments of FIGS. 5 and 6, which will now be described, but it is to be understood that statements made below relating to aspect ratios versus lamp numbers and characteristics apply to all embodiments of the invention.

Within certain limits, the greater the number and uniformity of the lamps, the lower the aspect ratio can be and still achieve the desired degree of uniformity of thermal flux across the entire workpiece. The "aspect ratio" is the distance of the lamps from the workpiece divided by the diameter of the optical cavity.

When there are many and uniformly-spaced lamps, the radiation therefrom does not have to reflect so many times in order to achieve the desired uniformity of thermal flux at the plane of the workpiece. When, on the other hand, there are but few lamps, more internal reflections are needed to achieve the desired uniformity of heating. Thus, the aspect ratio in the first-mentioned case is caused to be lower than in the second-mentioned case.

Other factors also have bearings on the desired aspect ratio. For example, causing the internal surfaces of the end walls of the optical cavity to be diffusely reflective instead of nondiffusely reflective can reduce the aspect ratio (however, such non-diffuse reflectors increase end-wall heating). Also, it is pointed out that where one of two aligned cavities has no substantial lamps therein, as in the illustrated example of FIGS. 1 and 2 (bottom end), the distance from the bottom end wall to the workpiece 18 can be very short. This is because radiation comes from the upper cavity (FIGS. 1 and 2), makes one pass downwardly through the lower cavity, reflects off reflector 33 of bottom end wall 32, and then passes upwardly to wafer 18—with numerous reflections off the sidewalls. The effective length of the lower cavity is thus doubled, permitting the lower cavity to be short.

As a general rule, the aspect ratio in a particular cavity should be at least about one when there are many uniformly-spaced lamps in such cavity. The aspect ratio should be substantially more than one, for example, two, when there are only few (or one) lamps in the cavity.

As stated above, aspect ratio is distance of lamps from the workpiece, divided by cavity "diameter". For kaleidoscopes having sides of equal length, viewed in cross-section, the "diameter" referred to above is substantially the diameter of a circle inscribed within the walls of the kaleidoscope. Thus, for example, for a kaleidoscope that is square in cross-section, such diameter is equal to the length of each side.

Relative to kaleidoscopes rectangular in cross-section, the desired aspect ratio is determined empirically by reference to the characteristics of kaleidoscopes square in cross-section. When the sides of the rectangle (viewed in section) are relatively equal in length, the aspect ratio is generally the same as or similar to that of a square-sectioned kaleidoscope. It is pointed out that the rectangular kaleidoscope should not be very long and narrow in section—have sidewalls the lengths of which are drastically different from the lengths of the other two walls—because many of the benefits described in this specification are lost. As an extreme example, when the sidewalls have lengths (in section) many times the lengths of the remaining two walls, the apparatus acts more like only two parallel reflectors, there being undesirably low reflections from the other two walls.

Except as specifically set forth, FIG. 5 corresponds to FIG. 4 and has been numbered correspondingly. In the embodiment of FIG. 5, the numerous CW lamps 17 of FIG. 4 are replaced by only a few CW lamps 17. For example, three such CW lamps are shown. The three lamps 17 are equally spaced across the cavity 16.

In FIG. 5, the lamps at both ends of the apparatus are few in number. There is, however, still sufficient uniformity of heat flux, at the plane of the workpiece, to satisfy the uniformity requirements of many semiconductor processes.

To achieve such uniformity, with relatively few lamps, the aspect ratio is made larger than 1, and preferably about 2. Thus, each set of lamps is located at a distance from workpiece 18 that is about twice the diameter of the cavity 16.

Figure 7:
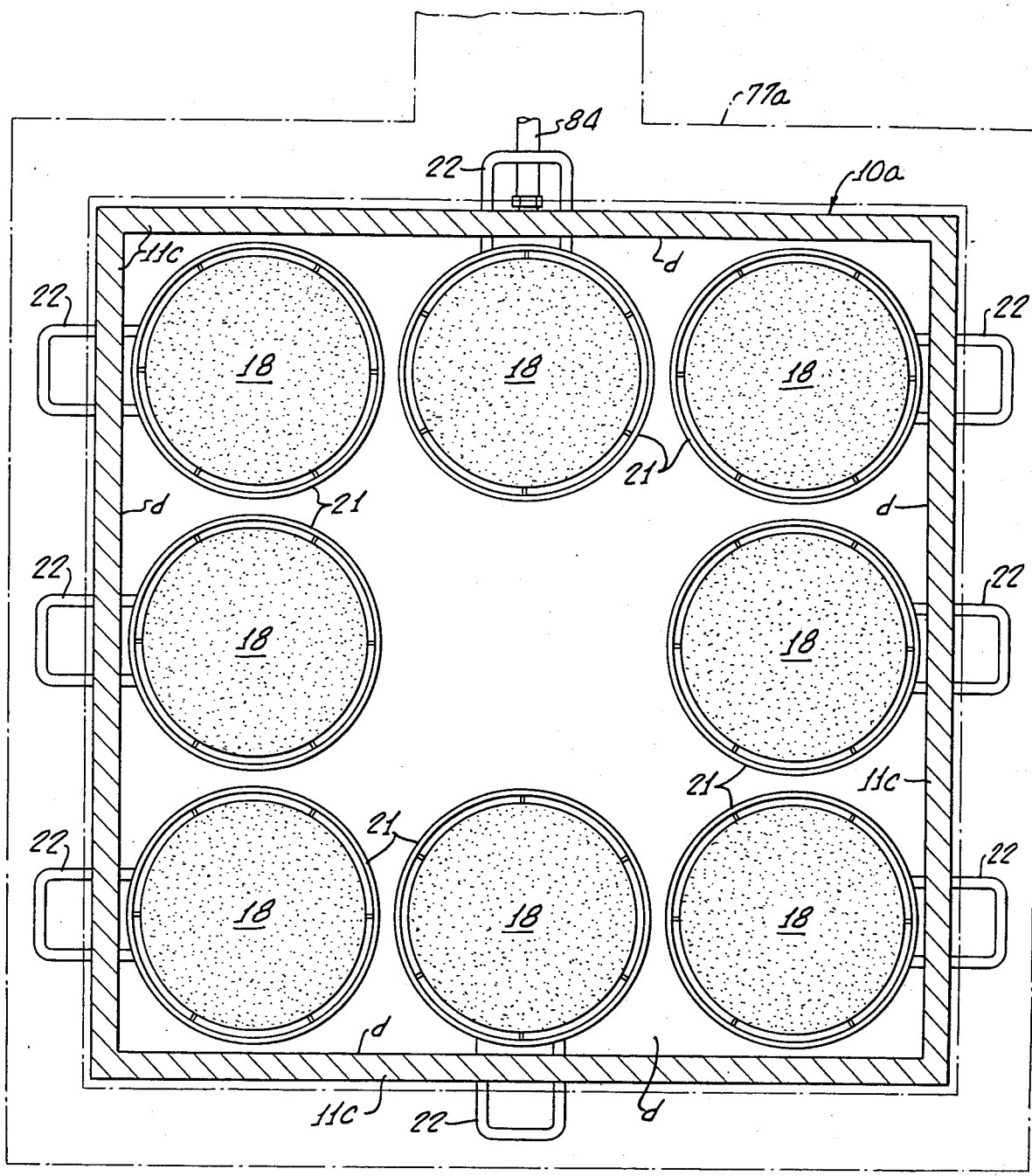
FIG. 7 corresponds to FIG. 3 but shows—in reduced scale—a larger, and otherwise modified, apparatus.

Referring next to the embodiment of FIG. 6, this is also identical to that of FIG. 4, except as specifically stated. In FIG. 7, the dense array of CW lamps 17 is located much closer to wafer 18 than is the case relative to FIG. 4. Stated more definitely, the aspect ratio in FIG. 7, relative to lamps 17, is about 1, the lamps 17 being spaced from the wafer a distance about equal to the diameter of the cavity. Because of the changes, certain reference numerals at the bottom of FIG. 6 are followed by the letter "b".

The radiation from the tightly-packed lamps 17 is not uniform, as might be thought. For example, the central lamps 17 in FIG. 6 are (assuming the same current) hotter than the outer lamps. This is especially true because the outer lamps 17 are near relatively cold walls.

Despite such (and other) disuniformity of thermal flux radiated from lamps 17, there is much less disuniformity than is the case relative to the few CW lamps 17 of FIG. 5, or relative to the few flash tubes 47. Accordingly, the aspect ratio relative to CW lamps 17 can be less in the embodiment of FIG. 6 than in that of FIG. 5.

The present apparatus and methods are extremely versatile in their ability to do many things needed by manufacturers in making semiconductor wafers, large scale integrated circuits, etc. This is because manufactures can now effect rapid and efficient uniform heating to substantially any temperature desired, in any desired atmosphere, and without substantial contamination. In some cases the temperatures will be high, at or near the melting points of the workpieces. In other cases the temperatures will be low. Furthermore, the heating may be—as desired by the manufacturer—isothermal, thermal flux or adiabatic, or certain combinations thereof.

When a large amount of heat is required, and/or when it is desired that the apparatus be compact, a bank or array of numerous lamps is used as described relative to FIGS. 1 and 2 and relative to the bottom portions of FIGS. 4 and 6—the latter FIG. showing a low aspect-ratio apparatus that is consequently compact. When the required heat is low, the number of lamps is reduced, as shown in FIG. 5, but the aspect ratio is caused to be more than one in order to achieve the desired degree of uniformity.

In all cases where the manufacturer desires a very high degree of thermal flux uniformity across the wafer or other workpiece, the aspect ratio and the number of lamps are caused to be sufficiently large—and the degree of perfection of the shape of the kaleidoscope is caused to be sufficiently high—that the thermal flux uniformity is as desired. The preferred range of such thus-achieved thermal flux uniformity across the workpiece is plus or minus a few percent, more preferably plus or minus 2%, but uniformities closer to plus or minus 1% are practically and efficiently achievable by the present apparatus and method.

As previously emphasized, the kaleidoscope with nondiffusely-reflective walls is greatly preferred over other types of light pipes. The only time a diffuse wall is sometimes desired is at the end or ends, in order to reduce the aspect ratio, and this is at the expense of power loss caused by increased heating of the end walls.

Kaleidoscopes having diffusely-reflective sidewalls can be made to work to a degree, especially where the diffusion is partial (walls quite smooth instead of rough).

Preferably, the kaleidoscope is substantially uniform in cross-sectional area throughout its length. Kaleidoscopes that converge steeply from the light source toward the workpiece tend to "trap" a large percentage of the light, so that it never reaches the workpiece. On the other hand, kaleidoscopes that diverge steeply from the light source toward the workpiece markedly reduce the number of re-reflections, and consequently the uniformity. Further, such divergent configurations leave but little room for the light sources.

The preferred cross-section of the kaleidoscope is square, as shown in the present drawings. Hexagonal kaleidoscopes can increase manufacturing difficulty, while triangular ones reduce effective work area (with no edge effects) for disc-shaped wafers, and also limit the lamp area.

APPARATUS OF FIG. 7

FIG. 7 corresponds—except as stated below—to FIG. 3, and except as specifically stated, the embodiment of FIG. 7 corresponds to that of FIGS. 1–3. However, the statements made relative to FIG. 7 apply not only to the embodiment of FIGS. 1–3 but also to other embodiments (for example, that of FIG. 4).

The size of the present apparatus may be increased markedly, so as to permit annealing or other process steps to be performed simultaneously relative to two or more wafers 18. Thus, for example, two wafers 18 may be treated in an apparatus (not shown) of rectangular section.

In FIG. 7, eight wafers are shown as supported by rings 21 about a large cavity of square cross-section. Such cavity has the same aspect ratio as shown and described relative to other embodiments. Thus, since the cavity of FIG. 7 is relatively large in section, the length of the optical cavity is proportionately larger.

The lamps must be greatly increased in number, power, etc., in the present embodiment where a plurality or workpieces 18 are simultaneously annealed or otherwise treated.

It is greatly preferred that the walls 11c of the optical cavity of FIG. 7 have nondiffusely-reflective coatings, as described above and for the reasons previously stated. However, in FIG. 7 the internal surfaces "d" are diffusely reflective (as by being lightly sand-blasted, chemically treated, or coated).

The adverse effects of the diffusing surfaces "d" of FIG. 7 (as compared to the nondiffusely reflective gold or other nondiffusely-reflective mirror surfaces described above) are lessened since there is no wafer 18 in the center of the cavity. Diffuse reflectors such as indicated at "d" tend to increase the amount of radiant energy at the center of the cavity, at the expense of the peripheral cavity regions.

DETAILED DESCRIPTION OF METHODS

Figure 8:
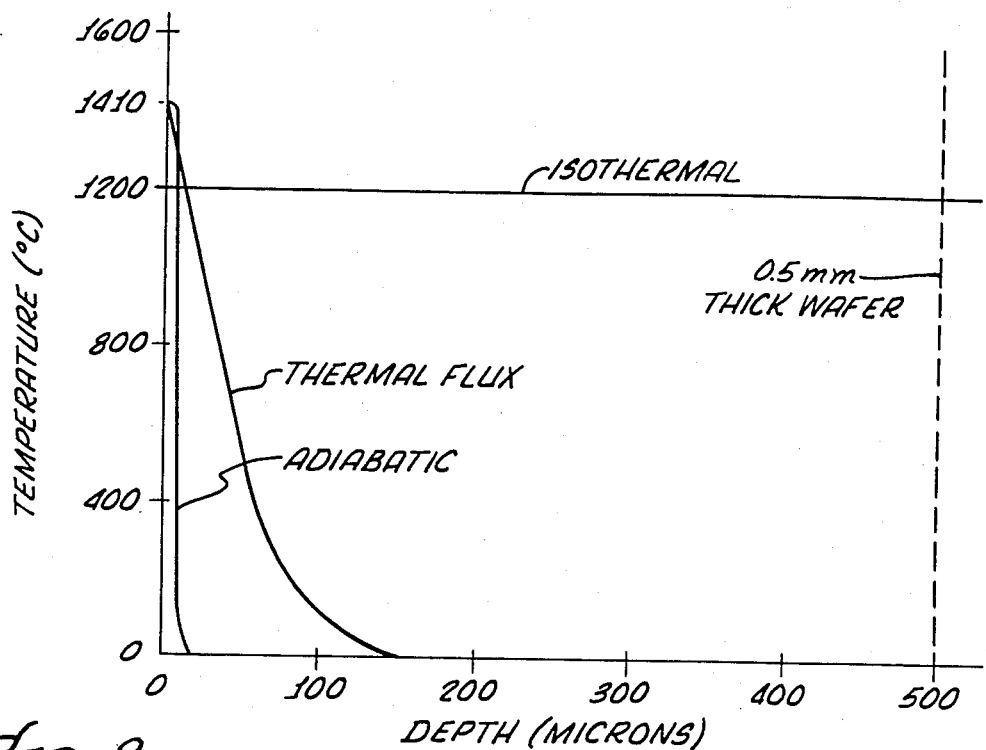
FIG. 8 is a graph showing temperature-depth relationships for isothermal, thermal flux and adiabatic heating.
Figure 9:
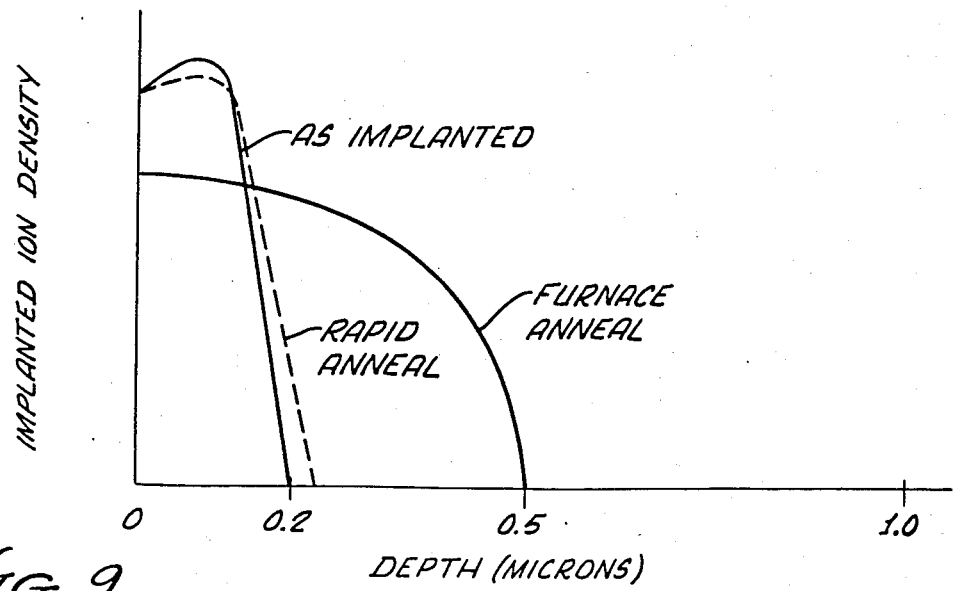
FIG. 9 is a graph illustrating typical implanted ion density at different depths, both as-implanted and after different types of annealing.

In accordance with a first method, a CW radiant source is employed in combination with an integrating light pipe to effect rapid and uniform heating of a semiconductor device, component or material to such a temperature, and for such a time period, as to achieve the desired effect. The rate of heating may be controlled as desired, in a programmed manner. The heating is isothermal, as defined under the Definitions portion at the beginning of the specification and as shown in FIG. 8. The light pipe is, in the greatly preferred form, the described kaleidoscope.

Where the desired effect is rapid annealing of an ion implanted semiconductor wafer, the method comprises supplying a large amount of power to the CW source, then drastically reducing the power as soon as a desired "holding" temperature is achieved, and then substantially reducing or turning off the power to permit cooling of the wafer. The power may be reduced in a programmed manner to fully control the cooling cycle, it being understood that cooling rate is far less rapid in the optical cavity than it would be in open space. Preferably, the temperature rise rate is (for silicon) in the range of 200°–500° C. per second. The holding temperature is, for silicon, preferably about 1000°–1200° C. and continues for several seconds, following which there is a cooling period of about ten or fifteen seconds. Exemplary time and temperature relationships are illustrated in FIG. 10 which shows the relatively steep temperature rise at the left, the flat holding period at the top, and the cooling period at the right. The curve relates to silicon, which has a melting point of approximately 1410° C.

As stated previously, the above-described first method is presently preferred at least for lower density dopant implants. There will next be described a second method, which is presently preferred for the higher density dopant implants.

The second method of rapid annealing a dopant implanted semiconductor wafer comprises effecting uniform isothermal heating of such a wafer to a predetermined temperature well below the melting point thereof, thereafter immediately effecting thermal flux heating of the upper (assuming that the upper side is the one that has been dopant implanted) surface region of the wafer, and thereafter permitting the wafer to cool. Preferably the thermal flux heating (as that term is defined under Definitions at the beginning of this specification) approaches the melting point of the semiconductor material but does not reach the same, as shown by the spike at the central region of FIG. 11 and in relation to the 1410° C. melting point of silicon.

Stated more specifically, the second method comprises effecting isothermal heating of the dopant implanted wafer by a CW radiant source, preferably an array of quartz halogen lamps, disposed within the optical cavity formed by the light pipe (preferably, the kaleidoscope). Power to the CW lamps is controlled in order to provide the temperature rise rate of 200°–500° C. (or more) per second. When the silicon wafer has reached a programmed temperature of 800°–1100° C., a second, high-power, pulsed lamp array is energized to quickly elevate the temperature of the dopant-implanted surface of the wafer to 1200°–1400° C., or higher, thus annealing the surface region and removing defects.

The method of combined heating provides rapid, efficient, and effective heating of the wafer without touching it or contaminating it in any way, there being no need for (for example) a hot plate. The multiple quartz halogen lamps and the multiple high-power (pulsed) lamps are provided in the same cavity in order to achieve combined isothermal-thermal flux heating of the semiconductor material. There is no need, in this or any embodiment, for a susceptor or diffuser to improve heating uniformity.

Pulse duration of the pulsed lamp array can be from five to one thousand microseconds. Absorbed thermal flux energy on the dopant-implanted surface of the semiconductor material can range from 0.5 J/cm$^2$ for a 5 microsecond pulse to as much as 10 J/cm$^2$ for a 1,000 microsecond pulse.

It is emphasized that, in the described second method and as shown in FIG. 11, the isothermal heating is preferably to a lower temperature than is the case when only isothermal heating (no pulse) is employed, as shown in FIG. 10. The spiking of the surface temperature to near the melting point of the semiconductor material greatly increases the annealing speed (much more so than would be the case if the temperature vs. anneal speed relationship were linear). Thus, a lower isothermal temperature can be used.

As an example, let it be assumed that the isothermal heating is employed to raise the temperature of the entire wafer uniformly up to about 1100° C. After a few seconds, the pulse source is energized to create the spike (FIG. 11) and raise the temperature of only the upper surface region to a peak near but not at the melting temperature of the particular semiconductor material (silicon, in the showing of FIG. 11). The pulse is sufficiently short to heat and anneal the region at least as deep as the depth (bottom) of the dopant implant layer, but the duration of the pulse is sufficiently short (especially after the isothermal heating) that slippage of silicon planes is minimized and, furthermore, overall heating of the body of the wafer is extremely small. Relative to the latter factor, the temperature of the entire wafer may only increase a few degrees, from the 1100° C. stated in the specific example, because of the shortness of the pulse which provides the thermal flux heating.

It is emphasized that for other semiconductor materials, such as gallium arsenide, the temperatures and/or times are changed. There is a major problem in the prior art relative to gallium arsenide, because of vaporization that occurs during slow (furnace) annealing. For gallium arsenide, the presently described second method may be employed to isothermally heat the wafer to a relatively low temperature at which no substantial vaporization occurs. Then, the pulsed lamps are employed for thermal flux heating to achieve (in combination with the isothermal heating) the desired annealing. Stated more definitely, the gallium arsenide semiconductor wafer is quick annealed, by the second method, by heating it isothermally to a temperature in the range of about 500°–600° C., and then spiking the surface temperature to about 950°–1000° C.

The combination of isothermal and thermal flux heating may be so performed that melting occurs, that is to say, the spike shown in FIG. 11 extends upwardly to 1410° C. (for silicon) and flattens off because of the latent heat of fusion. Melting is desired for some processes. However, when the process being performed is annealing, melting is not preferred. Melting may also be performed, when desired, by the first-described method, that of FIG. 10.

It is pointed out that the kaleidoscope and other apparatus described earlier in this specification may also be employed relative to pulse sources by themselves, in the absence of CW lamps or isothermal heating. The pulse (flash) sources of radiant energy may be such as to provide either thermal flux heating or adiabatic heating, reference being made to FIG. 8.

To increase the rate of production, means may be employed to increase wafer cooling speed. Thus, for example, the light pipes may be separated, and/or gas flow increased, during the cooling period.

FURTHER METHODS RELATING TO CERTAIN MATERIALS

The present apparatus and method uniformly heat silicon (or other) wafers in any controlled atmosphere, and with very accurate computer control of temperature, so that a wide variety of different process steps may be performed. The wafer may be brought to and held at one desired temperature while one step is performed, then changed to another temperature while another step is performed in the same—or a different—atmosphere. These can be sequential or simultaneous vapor deposition, annealing, diffusion, and other process steps. New alloys may be generated cheaply and effectively at the surface of a wafer, to achieve desired results such as reduced use of gold. Large scale integrated circuits may be built up using relatively low-cost silicon as the base material.

For example, the wafer may be heated in the presence of oxygen, nitrogen, or both, to create different types of insulating or dielectric layers in an integrated circuit.

Also, in the formation of low-resistance silicides, refractory metals such as tantalum, tungsten, molybdenum, titanium, etc., may be applied to the silicon by chemical vapor deposition at one desired temperature, then rapidly diffused or alloyed at another desired temperature. The surfaces may be melted, remelted, annealed, etc., as desired.

As previously indicated, silicide formation and annealing may be achieved sequentially or substantially simultaneously. Alloying may be performed, for example at the wafer surface, at any desired temperature—even one as low as 450° C. or lower.

Since no diffusers, susceptors, hot plates, etc., are required or desired, every step may be performed so fast—and without contamination—that the number of possible and practical process steps is vast.

DESCRIPTION OF LAMP-COOLING MEANS AND METHOD, AND POWER SOURCE AND CONTROL ELEMENTS

The upper portions of FIGS. 1 and 2, and the lower portion of FIG. 4, depict the number and type of lamps 17 preferably employed in the exemplary annealing apparatus wherein the wafer 18 has a diameter of six inches, and the internal diameter of the optical cavity is approximately seven inches. Twenty-seven lamps 17 are used, each lamp 17 having a rating of 1.5 kilowatts. Thus, the combined kilowatt ratings of the lamps 17 in the array total 40.5 kw.

There will next be described the apparatus for supplying power to the lamps 17 and effectively cooling them, without generating and maintaining excessive heat in the optical cavity 16 even when the apparatus is employed hour after hour in production. The description relates to FIGS. 1 and 2, but applies also to many other embodiments.

As shown in FIGS. 1 and 2, each lamp 17 (which is preferably a quartz halogen lamp) has a length substantially greater than the outer diameter of the optical cavity, so that the terminations 48 at the outer ends of the lamps are spaced away from the walls of such cavity. Terminations 48 are connected to bus bars 49-52 that are also spaced away from the cavity walls. Three of the bus bars, numbers 49-51, are disposed on one side of the optical cavity, and each is connected to the terminations 48 of nine of the lamps 17. The remaining bus bar, number 52, is provided on the other side of the optical cavity, and connected to all of the twenty-seven lamps.

A power supply 53, shown in FIG. 2, is suitably connected in delta or Y relationship to the three bus bars 49-51, and is also connected to the remaining bus bar 52, such lamps thus being supplied with three-phase power. Power supply 53 is of the SCR type, and preferably of the type where the power delivered to the lamps is controlled by a variable voltage. (One source of such a supply is the Vectrol Division of Westinghouse Corporation.) The control signal is delivered to power supply 53 from a computer 54 (FIG. 2) that is, in turn, connected to an optical pyrometer 56. The pyrometer 56 is directed through an inclined aperture 57 in a sidewall 11 at the center region of semiconductor wafer 18. Elements 53, 54 and 56 are adapted to cause the wafer temperature 18 to rise rapidly (in abrupt or programmed manner) to the desired level for the isothermal heating, as described above relative to FIGS. 10 and 11, thereafter to hold the desired temperature for a desired time period, and thereafter to discontinue (in abrupt or programmed manner) supply of power to the lamps.

Referring next to the cooling of the CW lamps, it is pointed out that the filaments of the lamps are entirely within the optical cavity. Thus, for example, each lamp 17 has a filament about 6.2 inches long and is disposed entirely within cavity 16. Much of the heat generated by the lamps is at the terminations 48, and these are spaced outwardly from the walls of the cavity as described. The present cooling apparatus and method cause a high degree of cooling of the terminations 48 and bus bars 49-52, by air flowing on both sides of the bus bars. The apparatus and method also cause sufficient cooling of those portions of lamps 17 within optical cavity 16 to prevent overheating of the apparatus without, at the same time, cooling the lamp tubes so much that the halogen vapor deposits thereon and reduces lamp efficiency.

A coolant housing 59 is mounted around the end of the optical cavity in spaced relationship therefrom and from bus bars 49-52. Air or other suitable coolant is supplied to the housing 59 through a conduit 60, and withdrawn from the housing through conduit 61. Suitable baffle means, such as vertical baffles 62, divide the coolant housing 49 into an inlet chamber 63 and an outlet chamber 64 between which coolant cannot flow except along two predetermined paths.

The first such path is a large-area path and it is past the end wall 12 of the optical cavity. The second path is into the interior of the end portion of the optical cavity 16, through oversized ports 66 provided one for each of the lamps 17. The ports 66 are preferably cylindrical and concentric with the lamps, so that the walls of the lamps do not touch walls 11 of the cavity. The lamps, instead of being supported by the cavity walls, are supported by the buses 49–52 which, in turn, are supported by insulating brackets 67 connected to the cavity walls.

Thus, air from inlet chamber 63 flows into the upper end of cavity 16 along and around each of the lamps 17, then flows through the upper portion of the optical cavity, then flows outwardly into chamber 64 for outflow via conduits 61. The end portions of the optical cavity are separated from the cavity portions adjacent wafer 18, by quartz windows 68 (and 68a, FIG. 4). Windows 68 need not be, and preferably are not, diffusing, being instead clear and transparent. Thus, air is prevented from reaching the wafer 18 and, furthermore, a controlled atmosphere may be provided on both sides of the wafer 18 as described subsequently.

The combination of the cooling means, the bus and end-termination means, and the windows 68 provides an effective and efficient cooling action. Walls 11 and 12 are thus prevented from overheating, it being pointed out that the bottom region of the coolant housing 59 is disposed closer to wafer 18 than is window 68, so that thermal conduction through walls 11 from the end portion of the cavity does not effect substantial heating of the cavity region adjacent wafer 18.

Because of the reflective characteristic of the interior surfaces of the kaleidoscope, the heating of a single wafer 18 to, for example, 1200° C., causes, over the time period indicated in FIG. 10, heating in FIG. 10, heating of the exterior surface of apparatus 10 by only a small amount, to substantially less than 150° F.

The cooling means for the flash lamps 47, shown at the upper portion of FIG. 4, are similar to those for the CW lamps 17, and are not described in detail. Also, the power supply for the flash lamps 47 may be of several types known in the art, and is therefore not described herein.

Cooling means, corresponding to the housing 59, etc., are preferably also provided around the kaleidoscope 29 (bottom of FIGS. 1 and 2).

DESCRIPTION OF AUTOMATED APPARATUS

Figure 12:
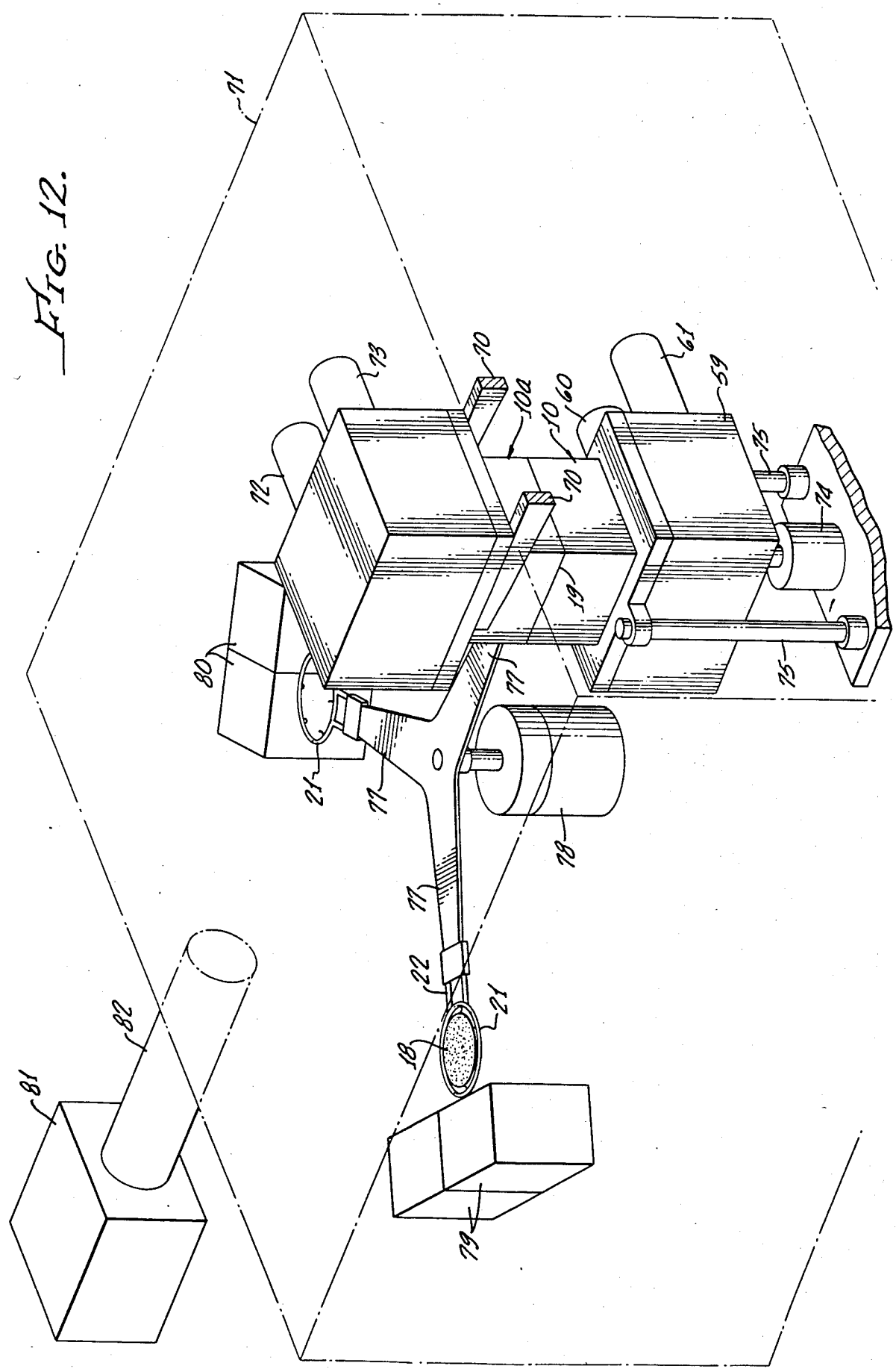
FIG. 12 is a schematic view of an automatic system for effecting rapid heating of semiconductor wafers in a production line.

The apparatus schematically represented in FIG. 12 relates to the embodiment of FIGS. 4 and 11, but it is to be understood that the apparatus is also applicable to the embodiment of FIGS. 1–3 and 10. In the latter instance, the flash lamps and associated cooling means are omitted.

The upper kaleidoscope, numbered 10a (FIGS. 4–6) is held stationary by suitable support means 70 connected to a housing, the latter being indicated by the phantom lines 71 in FIG. 12. Coolant air for the flash lamps and kaleidoscope 10a is provided and withdrawn through conduits 72 and 73 (FIG. 12) which extend through the housing 71.

The lower kaleidoscope 10 (FIGS. 4 and 5) is not held stationary but instead actuated upwardly and downwardly between the illustrated closed position and an open position (downwardly shifted) at which each quartz ring 21 with wafer 18 thereon may be pivoted in a horizontal plane into or out of the optical cavity. Referring to FIG. 12, a fluid-operated cylinder 74 and associated guides 75 are employed for raising and lowering the kaleidoscope 10 and associated cooling apparatus. The conduits 60 and 61 connecting to the coolant apparatus, and extending to the exterior of housing 71, are made suitably flexible to permit the described vertical shifting.

There are three shpport rings 21, mounted in a horizontal plane by means of a rotating support apparatus 77 that is driven by an actuator 78. There are two loading cassettes 79 at one station within housing 71, and two unloading cassettes 80 at another station therein. Suitable pick and place mechanisms, not shown, are provided to shift the wafers 18 into and out of the loading and unloading cassettes 79 and 80, respectively. The provision of two cassettes 79, and two cassettes 80, permits continuous production-line operation.

The cassettes are introduced into and withdrawn from housings 71 through "airlocks" (not shown), and a desired atmosphere is provided within the housing 71 and thus within the optical cavity. This atmosphere may be argon, nitrogen, helium, etc. (In different processes, the gas may be oxygen or various others.) The gas is supplied from a suitable source 81 via a conduit 82. Direct connection of the gas source 81 to the optical cavity may also (or alternatively) be effected, via conduits 83 and 84 indicated in FIGS. 2 and 4–6, and gas flow is effected through such conduits to increase cooling speed.

Continuous production-line operation may then be achieved by first signaling the actuator 74 to lower the bottom kaleidoscope 10, then signaling the actuator 78 to rotate the apparatus 77 120° so that an untreated wafer 18 is indexed into the space between the upper and lower kaleidoscopes. Then, actuator 74 is signaled to raise kaleidoscope 10 and thus cause opposed edges of the upper and lower kaleidoscopes 10a and 10 to meet each other and create a closed optical cavity in which the wafer 18 is disposed as shown in FIG. 4.

The radiant thermal sources 14 and 46 are then operated as described above, to create the combined isothermal and thermal flux annealing of wafer 18. Thereafter, actuator 74 is actuated to lower the bottom kaleidoscope 10, and actuator 78 is signaled to rotate the apparatus 77 and thus index the treated wafer 18 to the unloading station adjacent unloading cassettes 80 for unloading by the pick and place machine, not shown. The wafer is not shifted out of the cavity until it is sufficiently cool that it will not be damaged.

The quartz handle 22 on support ring 21 extends through grooves (corresponding to grooves 23 in FIG. 1) in the upper edge of a wall 11 of lower kaleidoscope 10 (FIG. 4). Such handle is connected to one of the arms of apparatus 77.

It is emphasized that the region surrounding wafer 18 is separated, by the quartz windows 68 and 68a, from the end portions of the kaleidoscopes. There is little or no movement of the inert atmosphere adjacent wafer 18 when heating is occurring, this being desired because substantially all heating is to be radiant, instead of conductive or convective, for maximized uniformity of wafer temperature across the various diameters thereof. On the other hand, as stated previously, cooling rate may be increased by creating a flow of inert gas over the wafer during the cooling period.

There will next be indicated an automation apparatus for the embodiment described relative to FIG. 7, the larger apparatus capable of heating, simultaneously and in one large cavity, a substantial number of semiconductor wafers. One such automation apparatus is a large merry-go-round each arm of which supports—from a cavity-encompassing square element 77a—all eight (or other number) wafer-support rings 21. In another form, the wafer-support means move linearly instead of rotationally, there being a "conveyor belt", each large "link" of which is a square, that supports the inwardly-directed rings.

Relative to all embodiments, it is greatly preferred that the lower portion of the optical cavity (that beneath the wafers or wafer) be present. Furthermore, it is preferred that such lower portion be closed (moved up) to the upper portion before each heating step. However, less preferably, instead of moving the entire lower cavity portion, upwardly moving shutters or the like may be provided on the upper rim of a stationary lower cavity. Even less preferably, there may be a gap present between the lower and upper cavity portions during the heating step. Such a gap should be kept as small as possible, it being understood that the wafer-support means may be so constructed as to be very close to planar.

It is emphasized that, in all embodiments, the walls of the optical cavities are relatively cool because of the high degree of reflection from the reflective internal coatings. Nevertheless, for some applications, means are provided to effect efficient cooling of the cavity walls. As an example, in a process where a workpiece is heated continuously for one-half hour in an oxidizing atmosphere for the purpose of achieving an oxide layer of desired thickness, the cavity walls are water cooled by providing passages therethrough and effecting continuous flow of water through such passages.

DRAWINGS OF THE OPTICAL CAVITIES HAVING NON-SQUARE NESTING CROSS-SECTIONAL SHAPES

Figure 13:
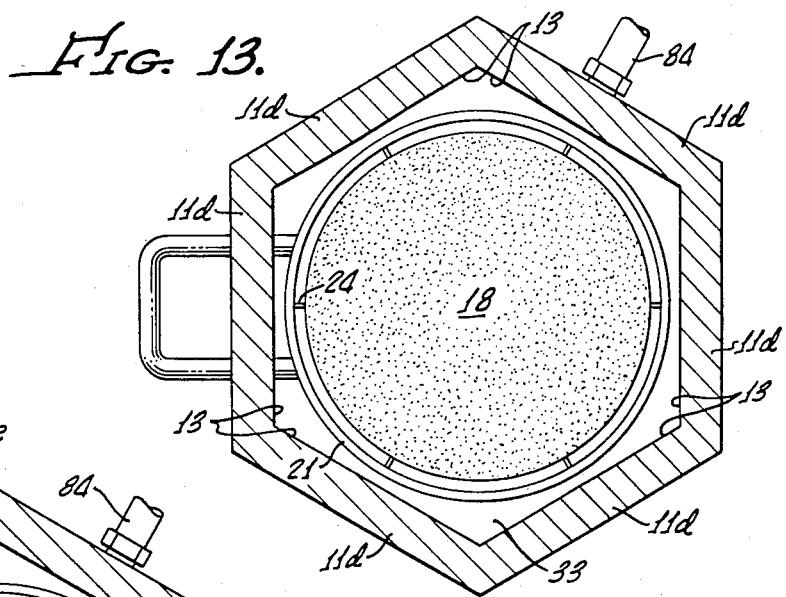
FIG. 13 is a horizontal sectional view corresponding to FIG. 3 but showing the form in which the cross-sectional shape of the optical cavity is a regular hexagon.
Figure 14:
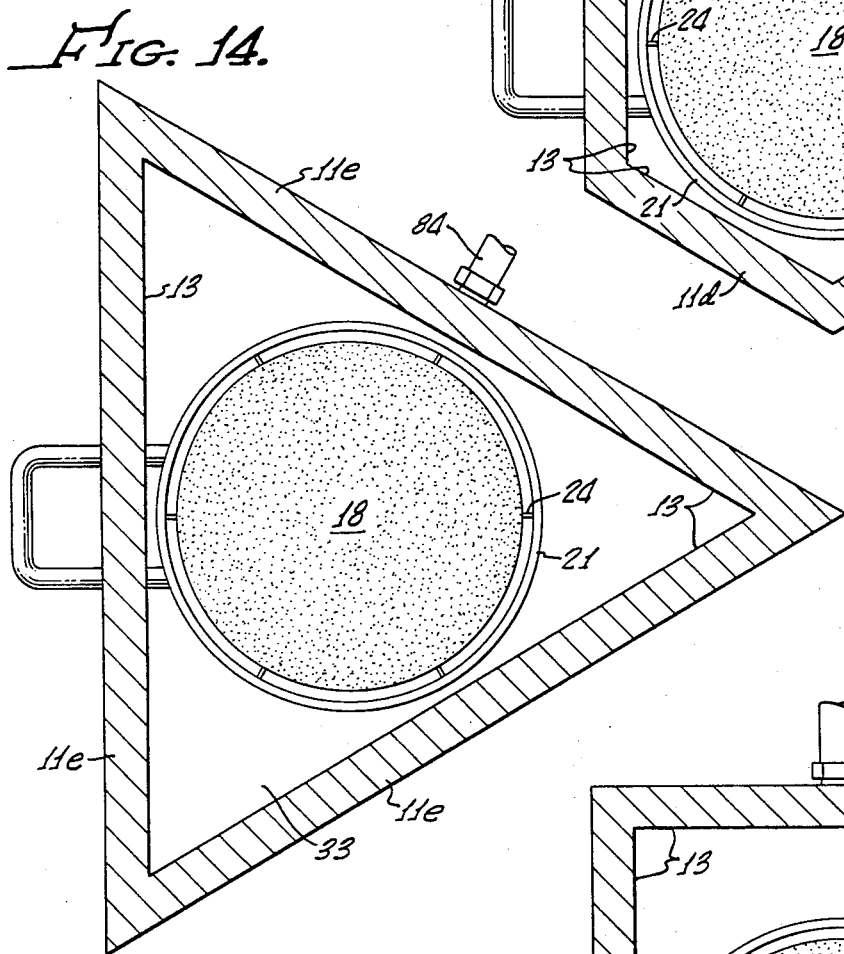
FIG. 14 is a horizontal sectional view corresponding to FIG. 3 but showing the form in which the cross-sectional shape of the optical cavity is an equilateral triangle.
Figure 15:
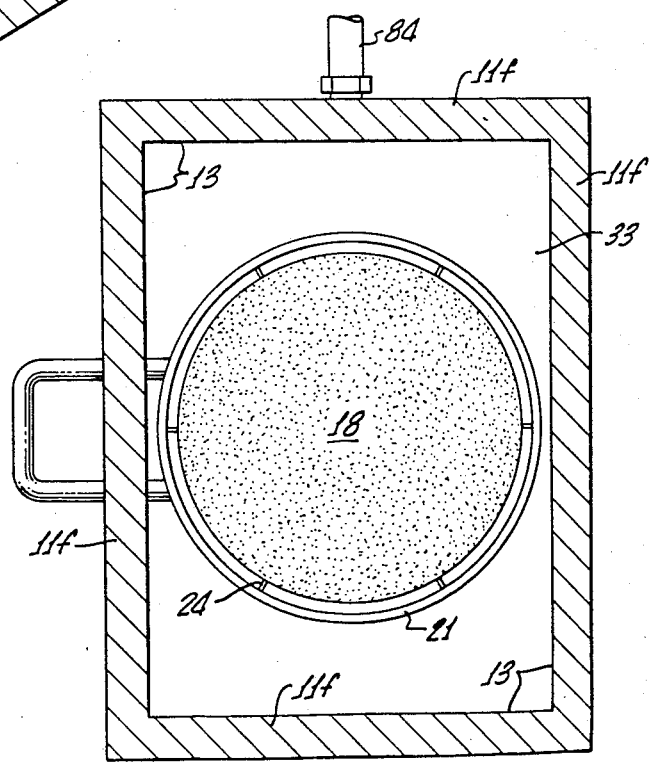
FIG. 15 is a horizontal sectional view corresponding to FIG. 3, but showing the form in which the cross-sectional shape of the optical cavity is a rectangle.

FIGS. 13–15 all correspond to FIG. 3 but illustrate the three remaining cross-sectional shapes of the optical cavity or kaleidoscope, namely the regular hexagon, the equilateral triangle, and the rectangle. In FIGS. 13–15, the numbers applied to the wafer, wafer support, reflecting coatings and conduit are the same as in FIG. 3. The only structural difference between the embodiments of FIGS. 13–15 and that of FIGS. 1–3 is the cross-sectional shape of the cavity. Thus, the walls of the hexagonal form (FIG. 13) are numbered 11d; the walls of the triangular form (FIG. 14) are numbered 11e; and the walls of the rectangular form (FIG. 15) are numbered 11f.

The foregoing detailed description is to be clearly understood as given by way of illustration and example only, the spirit and scope of this invention being limited solely by the appended claims.

What is claimed is:

1. A method of rapid annealing dopant-implanted semiconductor wafers, comprising:
   (a) employing CW lamp means and an integrating light pipe to effect relatively uniform isothermal heating of a dopant-implanted semiconductor wafer to a relatively high temperature less than the melting point of the semiconductor material forming said wafer,
   (b) causing the aspect ratio to be at least 1, and
   (c) maintaining said heating for a sufficient number of seconds to achieve rapid annealing.

2. The invention as claimed in claim 1, in which the power to said CW lamp means is so controlled as to effect a temperature rise rate in the range of about 200° C. to about 500° C. per second, and in which said high temperature is in the range of about 1000° C. to about 1200° C.

3. The invention as claimed in claim 2, in which said semiconductor wafer is silicon.

4. A combination method of rapid annealing a dopant-implanted semiconductor wafer, comprising:
   (a) employing CW lamp means and an integrating light pipe to effect relatively uniform isothermal heating of a dopant-implanted semiconductor wafer,
   (b) employing pulsed lamp means and an integrating light pipe to effect substantially uniform thermal flux heating of the dopant-implanted surface region of said wafer after said isothermal heating step has generated an elevated temperature in the semiconductor material forming said wafer, and
   (c) causing the aspect ratio relative to said CW lamp means and said pulsed lamp means to be at least 1.

5. A combination method of rapid annealing a dopant-implanted semiconductor wafer formed of silicon, said method comprising:
   (a) employing CW lamp means and an integrating light pipe to effect relatively uniform isothermal heating of a dopant-implanted semiconductor wafer formed of silicon, to a temperature in the range of about 800° C. to about 1100° C., and
   (b) employing pulsed lamp means and an integrating light pipe to effect substantially uniform thermal flux spike-heating of the dopant-implanted surface region of said wafer, to a temperature in the range of about 1200° C. to about 1400° C., after said isothermal heating step has generated the elevated temperature in the semiconductor material forming said wafer.

6. A combination method of rapid annealing a dopant-implanted semiconductor wafer formed of gallium arsenide, said method comprising:
   (a) employing CW lamp means and an integrating light pipe to effect relatively uniform isothermal heating of a dopant-implanted semiconductor wafer formed of gallium arsenide, to a temperature in the range of about 500° C. to about 600° C., and
   (b) employing pulsed lamp means and an integrating light pipe to effect substantially uniform thermal flux spike-heating of the dopant-implanted surface region of said wafer, to a temperature in the range of about 950° C. to about 1000° C., after said isothermal heating step has generated the elevated temperature in the semiconductor material forming said wafer.

7. A method of quick annealing the dopant-implanted surface of a semiconductor wafer having a diameter of at least 3 inches, comprising:
   (a) effecting substantially uniform isothermal heating of a dopant-implanted semiconductor wafer, having a diameter of at least 3 inches, across the entire area thereof by CW lamp means,
   (b) effecting, substantially concurrently with said step (a), substantially uniform thermal flux heating of the dopant-implanted surface of said wafer, across the entire area of said wafer, by pulsed means, and
   (c) effecting said substantially uniform isothermal heating and said substantially uniform thermal flux heating in an optical cavity, the aspect ratio relative to said CW lamp means being at least 1, to thereby effect said annealing.

8. The invention as claimed in claim 7, in which the method is so performed that the uniformity of the heating across the entire wafer is within plus or minus 2 percent, and in which said method further comprises causing said optical cavity to have a substantially nesting cross-sectional shape.

9. A method of heating a large-diameter semiconductor wafer, comprising:
   (a) employing a kaleidoscope and a source of radiant thermal energy to apply to at least one surface of a large-diameter semiconductor wafer a radiant thermal flux which is substantially uniform across the entire wafer,
   said step (a) including causing said radiant source and wafer to be in said kaleidoscope, with said wafer spaced from said source a substantial distance axially of said kaleidoscope, and further including causing the aspect ratio in said kaleidoscope to be at least 1, and
   (b) employing said substantially uniform radiant thermal flux to heat said wafer at such temperatures and for such time period as to achieve a desired process step relative to said wafer.

10. The invention as claimed in claim 9, in which said method further comprises causing said kaleidoscope to have a reflective end wall lying in a plane perpendicular to the axis of said kaleidoscope.

11. A method of heating a semiconductor wafer to achieve a desired effect, comprising:
   (a) providing, within an integrating light pipe, incoherent lamp means having sufficient power to heat said wafer to the desired temperature, and
   (b) providing a semiconductor wafer at a distance from said lamp means, longitudinally of said light pipe, sufficient that said integrating light pipe renders substantially uniform across said entire wafer the radiant thermal energy from said lamp means, said distance being sufficient that the aspect ratio is at least 1, and
   (c) effecting the desired heating of said wafer by said substantially uniform radiant thermal energy.

12. The method as claimed in claim 11, in which said lamp means comprises CW lamps.

13. The invention as claimed in claim 11, in which said method further comprises employing both pulsed lamp means and CW lamp means as said lamp means, and effecting combination heating of said semiconductor wafer by both of said lamp means, said CW lamp means being initially operated prior to operation of said pulsed lamp means.

14. The invention as claimed in claim 11, in which said method further comprises employing a kaleidoscope as said integrating light pipe.

15. A method of heating large-diameter semiconductor wafers, comprising:
   (a) providing a kaleidoscope having a closed and internally-reflective end, and containing, relatively adjacent said end, a source of radiant thermal energy,
   (b) employing said kaleidoscope to render substantially uniform the radiation from said energy source,
   (c) disposing a large-diameter semiconductor wafer at a location where said energy is thus relatively uniform, said location being such that the aspect ratio is at least 1, and
   (d) employing said uniform energy to heat said wafer substantially uniformly.

16. The invention as claimed in claim 15, in which said method further comprises effecting annealing by means of said heating.

17. The invention as claimed in claim 15, in which said method comprises disposing said wafer internally of said kaleidoscope in spaced relationship from the end of said kaleidoscope remote from said energy source, and further comprises employing a kaleidoscope wherein said end remote from said energy source is closed and internally reflective.

18. A method of heating a large-diameter semiconductor wafer, comprising:
   (a) providing first and second hollow integrating light pipes in axially-adjacent end-to-end relationship,
   (b) effecting relative axial movement between said light pipes to separate the adjacent end portions thereof,
   (c) introducing a large-diameter semiconductor wafer between the relatively adjacent ends of the thus-separated light pipes, until said wafer is between the spaces within said light pipes,
   (d) effecting relative axial movement of said light pipes to substantially close the space therebetween, and
   (e) providing radiant thermal energy in both of said light pipes to effect heating of said semiconductor wafer from both sides thereof by radiant thermal energy that is substantially uniform across said wafer.

19. The invention as claimed in claim 18, in which said method comprises employing light pipes that are closed at the ends thereof remote from said wafer, the closures being internally reflective, and in which said method further comprises generating said radiant thermal energy by lamps disposed within at least one of said light pipes at a distance spaced from said wafer sufficiently far that the resulting thermal flux is substantially uniform across said wafer.

20. The invention as claimed in claim 18, in which said method is employed to effect annealing of said wafer after a surface thereof has been implanted with dopant.

21. The invention as claimed in claim 18, in which each of said light pipes is a kaleidoscope.

22. The invention as claimed in claim 18, in which said method further comprises separating said end portions as soon as said heating has been completed, to thus increase the rate of cooling of said wafer.

23. The invention as claimed in claim 22, in which said method further comprises flowing gas across said wafer as soon as separation occurs, to further increase cooling rate.

24. A method of performing a process step in the manufacture of a large-diameter semiconductor component, which comprises:
   (a) providing an optical cavity having reflective interior surfaces so constructed and related that radiant heat energy from incoherent radiant-heat source means located in a region of said optical cavity is, by numerous reflections and re-reflections off said reflective interior surfaces, rendered uniform, within plus or minus a few percent, across a large-diameter target area,
   (b) providing incoherent radiant-heat source means in said region of said cavity,
   (c) providing a large-diameter semiconductor component at said target area and in such orientation that heat from said radiant-heat source means is uniformly distributed, within plus or minus a few percent, across said component, the aspect ratio being at least 1, (d) providing a controlled atmosphere around said component, and (e) energizing said radiant-heat source means for a time period sufficient to heat said semiconductor component for performance of a process step relative to said component.

25. The invention as claimed in claim 24, in which said method further comprises causing said reflective interior surfaces to be nondiffusely reflective.

26. The invention as claimed in claim 24, in which said method further comprises causing said reflective interior surfaces to be diffusely reflective.

27. The invention as claimed in claim 24, in which said method further comprises so relating said radiant-heat source means and said component that all radiant heat energy from said source means must travel in said cavity, between said source means and said component, a distance in the range of from about one diameter of said cavity to at least about two diameters of said cavity.

28. The invention as claimed in claim 24, in which said method further comprises causing said cavity to have a substantially nesting cross-sectional shape.

29. The invention as claimed in claim 24, in which said method further comprises not locating any hot plate near or in contact with said semiconductor component.

30. The invention as claimed in claim 24, in which said method further comprises not locating any susceptor near or in contact with said semiconductor component.

31. The invention as claimed in claim 24, in which said method further comprises not putting a diffuser in the path of radiant heat from said source means to said semiconductor component, and not contacting said component with any susceptor or hot plate.

32. The invention as claimed in claim 24, in which said method further comprises causing said semiconductor component to be a large-diameter semiconductor wafer.

33. The invention as claimed in claim 24, in which said method further comprises causing said controlled atmosphere to be a gas selected from a group consisting of argon, helium, oxygen, nitrogen, and mixtures thereof.

34. The invention as claimed in claim 24, in which said method further comprises causing said semiconductor component to be a large-diameter semiconductor wafer implanted with dopant, and in which said process step is annealing of said wafer.

35. The invention as claimed in claim 24, in which said method further comprises causing said semiconductor component to be a semiconductor wafer having a layer of refractory metal thereon, and in which said process step is silicide formation.

36. The invention as claimed in claim 24, in which said method further comprises causing said semiconductor component to be a semiconductor wafer, and in which said method further comprises effecting said heating in the presence of a gas selected from a group consisting of oxygen, nitrogen, and mixtures thereof, and in which said process step is formation of an insulating or dielectric layer.

37. A method of semiconductor-wafer heating, comprising:

(a) providing an optical cavity having a substantially nesting cross-sectional shape, and having sidewalls all of which are highly reflective on the interior surfaces thereof, (b) providing a source of radiant heat energy within said optical cavity, (c) supporting a semiconductor wafer in said cavity and in spaced relationship from said energy source, at such location that the radiant energy from said source, and passing through said optical cavity, will strike and heat said wafer, and (d) causing the aspect ratio in said cavity to be at least 1.

38. The invention as claimed in claim 37, in which said method further comprises providing said source of radiant heat energy in the form of a source of incoherent light.

39. The invention as claimed in claim 37, in which said method further comprises causing said interior surfaces of the walls of said cavity to be nondiffusely reflective.

40. The invention as claimed in claim 37, in which said method further comprises causing said interior surfaces of the walls of said cavity to be diffusely reflective.

41. The invention as claimed in claim 37, in which said method further comprises causing the aspect ratio in said cavity to be about 2.

42. The invention as claimed in any of claims 28, or 37–40, inclusive, or 41, in which said nesting cross-sectional shape is a square.

43. A method of performing a process step relative to a semiconductor wafer, which comprises:

(a) providing an integrating light pipe, (b) effecting isothermal heating of a semiconductor wafer by employing a radiant thermal source disposed in said light pipe, the aspect ratio being at least 1, and (c) effecting pulse heating of at least one surface of said wafer while it is hot as the result of said isothermal heating.

44. The invention as claimed in claim 43, in which said method further comprises employing as said integrating light pipe a light pipe having a nesting cross-sectional shape.

45. The invention as claimed in claim 43, in which said method further comprise employing as said integrating light pipe a kaleidoscope.

46. A method of performing at least one step relative to semiconductor wafers, said method comprising:

(a) providing an optical cavity having a nesting cross-sectional shape, and having a size sufficiently large to receive, in a plane perpendicular to the axis of said cavity, at least one of the semiconductor wafers to be treated, said cavity having sidewalls, the interior surfaces of all sidewalls of said cavity being caused to be highly reflective, (b) providing a bank of lamps in said cavity in a plane perpendicular to the axis of said cavity, (c) providing wafer-support elements in said cavity and shaped to be in only small-area contact with a wafer, to support said wafer in a second plane that is perpendicular to said cavity axis and is spaced a substantial distance from said first-mentioned plane, (d) causing the aspect ratio in said cavity to be at least 1, (e) providing light-transmissive separator means between said wafer-support elements and said lamps, (f) disposing a semiconductor wafer on said wafer-support elements, (g) providing a controlled atmosphere around said wafer, on the side of said separator means remote from said lamps, (h) energizing said lamps to heat said wafer, and (i) de-energizing said lamps to cause said wafer to cool.

47. The invention as claimed in claim 46, in which said method further comprises causing said nesting cross-sectional shape to be a substantial square.

48. The invention as claimed in claim 46, in which said method further comprises causing said separator means to be a transparent window.

49. The invention as claimed in claim 46, in which said method further comprises not using any diffuser or susceptor relative to said heating of said wafer.

50. The invention as claimed in any of claims 28, or 37–40, inclusive, or 41, or 46, in which said nesting cross-sectional shape is a regular hexagon.

51. The invention as claimed in any of claims 28, or 37–40, inclusive, or 41, or 46, in which said nesting cross-sectional shape is an equilateral triangle.

52. The invention as claimed in any of claims 28, or 37, 41, or 46, in which said nesting cross-sectional shape is a rectangle.

53. The invenion as claimed in any of claims 1, 4, 7, 9, 11, 15, 24, 37, 43, and 46, in which said aspect ratio is substantially greater than 1.

54. A method of heating a semiconductor wafer, said method comprising:
(a) providing a hollow, integrating light pipe that causes the intensity of light to become relatively uniform across said pipe by reflections and rereflections as the light moves along said pipe,
(b) providing lamp means to create incoherent thermal radiation and to transmit such radiation along said pipe,
(c) supporting a semiconductor wafer surrounded by a controlled atmosphere in such position as to be struck by radiation radiated from said lamp means and integrated by said pipe, said supporting step (d) being such that the location of said semicondutor wafer is sufficiently far from said lamp means, in a direction perpendicular to a cross-section of said pipe, that said wafer will be relatively uniformly heated by radiation radiated from said lamp means and integrated by said pipe, the aspect ratio being at least 1, and
(d) providing a window between said semiconductor wafer and said lamp means to contain said controlled atmosphere and maintain it out of contact with said lamp means.

55. The method as claimed in claim 54, in which said method further comprises causing said integrating light pipe to be a kaleidoscope.

56. A method of effecting double-sided and substantially uniform heating of a semiconductor wafer, said method comprising:
(a) providing a kaleidoscope that causes the intensity of light to become relatively uniform across said kaleidoscope by reflections and rereflections as the light moves along said kaleidoscope,
(b) closing one end of said kaleidoscope by an inwardly-facing reflective end-closure wall,
(c) supporting a semiconductor wafer within said kaleidoscope at an intermediate region thereof, said supporting step and said wafer respectively having such characteristics and such size as to permit a substantial percentage of radiant thermal energy within said kaleidoscope to pass along said kaleidoscope past said wafer, the aspect ratio in said kaleidoscope being at least 1, and
(d) supplying radiant thermal energy to said kaleidoscope at a region farther from said reflective end-closure wall than is said wafer,
said method causing said wafer to be heated relatively uniformly on both sides,
one side of said wafer being heated by radiant thermal energy resulting from said step (d) and directed and integrated by said kaleidoscope,
the other side of said wafer being heated by radiant thermal energy resulting from said step (d) and directed and integrated by said kaleidoscope, then passing past said wafer, then reflecting off said reflective end-closure wall, and then being directed and integrated by said kaleidoscope back to said other side of said wafer.

57. A method of effecting double-sided and relatively uniform heating of a semiconductor wafer, said method comprising:
(a) providing a hollow, integrating light pipe that operates, by reflections and rereflections, to cause the intensity of light to become substantially uniform across said pipe as the light moves along said pipe,
(b) closing both ends of said pipe by inwardly-facing reflecting end walls,
(c) supporting a semiconductor wafer, in a controlled atmosphere, within said pipe at a region intermediate said reflecting end walls,
said wafer having such size and characteristics as to permit a substantial percentage of radiant thermal energy within said pipe to pass along said pipe past said wafer, and
(d) disposing lamp means within said pipe relatively adjacent one of said reflecting end walls, and radiating thermal energy from said lamp means both toward and away from said one wall,
said method effecting heating of said wafer relatively uniformly on both sides,
one side of said wafer being heated by radiant thermal energy from said lamp means and directed and integrated by said pipe,
another side of said wafer being heated by radiant thermal energy from said lamp means, directed and integrated by said pipe, and then passing past said wafer to engage the other of said reflecting end walls, and then being directed and integrated by said pipe back to said other side of said wafer,
the aspect ratio in said light pipe being at least 1,
said wafer being disposed a substantial distance from each of said reflecting end walls.

58. A semiconductor wafer-heating method, comprising:
(a) providing a plurality of inwardly-facing reflective surfaces in such relationship to each other as to define an optical cavity having a substantially nesting cross-sectional shape,
(b) disposing, in said optical cavity, lamp means forming a source of radiant heat energy, and (c) supporting a semiconductor wafer in said cavity in spaced relationship from said lamp means, the direction of said spacing being perpendicular to a cross section of said cavity, said wafer-supporting step being such that when a wafer is thus supported, the radiant heat energy from said lamp means and passing through said optical cavity will heat said wafer, the shape of said optical cavity and the amount of such spacing of said wafer from said lamp means being such that said wafer is substantially uniformly heated, the aspect ratio in said optical cavity being at least 1.

59. The method as claimed in claim 58, and further comprising providing an inwardly-facing reflective closure wall across said optical cavity on the side of said lamp means remote from said wafer, and so orienting said last-mentioned wall that it is perpendicular to the axis of said optical cavity.

60. The invention as claimed in claim 58, in which said method further comprises causing said nesting cross-sectional shape to be a square.

61. The invention as claimed in claim 58, in which said method further comprises causing said nesting cross-sectional shape to be a regular hexagon.

62. The invention as claimed in claim 58, in which said method further comprises causing said nesting cross-sectional shape to be an equilateral triangle.

63. The invention as claimed in claim 58, in which said method further comprises causing said nesting cross-sectional shape to be a rectangle.

64. The method as claimed in claim 58, in which said method further comprises maintaining said wafer in a controlled atmosphere, and providing a window to separate said lamp means from said controlled atmosphere.

65. A method heating a workpiece, which comprises:
(a) defining an elongate optical cavity having reflective inwardly-facing side walls and having a substantially nesting cross-sectional shape,
(b) closing both ends of said cavity by closures having inwardly-facing reflective surfaces perpendicular to the longitudinal axis of said cavity, and
(c) providing incoherent source means of radiant-heat energy in a region of said cavity, and
(d) supporting a workpiece at a target region in said cavity, the aspect ratio in said cavity being at least 1, said method causing much of the incoherent radiant heat energy from said source means to be reflected and rereflected many times before traveling from said source means to said workpiece, much of the incoherent radiant heat energy from said source means passing past said workpiece to one of said closures and then being reflected back, and being reflected off said inwardly-facing side walls defining said optical cavity, said method thus effecting heating of said workpiece on both sides.

* * * * *

UNITED STATES PATENT AND TRADEMARK OFFICE
CERTIFICATE OF CORRECTION

PATENT NO.  :  4,698,486

DATED       :  October 6, 1987

INVENTOR(S) :  Ronald E. Sheets

It is certified that error appears in the above-identified patent and that said Letters Patent is hereby corrected as shown below:

Column 7, line 23, delete "termal" and substitute therefor ---thermal---.

Claim 45 (column 26, line 45), delete "comprise" and substitute therefor ---comprises---.

Claim 52 (column 27, line 25), delete "37," and substitute therefor ---37-40, inclusive,---.

Signed and Sealed this

Twenty-eighth Day of February, 1989

Attest:

DONALD J. QUIGG

Attesting Officer

Commissioner of Patents and Trademarks